United States Patent
Bae et al.

(10) Patent No.: US 12,161,024 B2
(45) Date of Patent: Dec. 3, 2024

(54) DISPLAY APPARATUS

(71) Applicant: Samsung Display Co., Ltd., Yongin-si (KR)

(72) Inventors: Kwangsoo Bae, Yongin-si (KR); Jinyong Lee, Yongin-si (KR); Kwangwoo Park, Yongin-si (KR); Sanghyun Choi, Yongin-si (KR); Chaungi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 429 days.

(21) Appl. No.: 17/706,507

(22) Filed: Mar. 28, 2022

(65) Prior Publication Data

US 2022/0310728 A1 Sep. 29, 2022

(30) Foreign Application Priority Data

Mar. 29, 2021 (KR) ........................ 10-2021-0040505

(51) Int. Cl.
| | |
|---|---|
| *H01L 27/32* | (2006.01) |
| *H10K 50/86* | (2023.01) |
| *H10K 59/122* | (2023.01) |
| *H10K 59/123* | (2023.01) |
| *H10K 59/38* | (2023.01) |

(52) U.S. Cl.
CPC ......... *H10K 59/123* (2023.02); *H10K 50/865* (2023.02); *H10K 59/122* (2023.02); *H10K 59/38* (2023.02)

(58) Field of Classification Search
CPC ... H10K 59/123; H10K 50/865; H10K 59/122
See application file for complete search history.

(56) References Cited

U.S. PATENT DOCUMENTS

| | | | |
|---|---|---|---|
| 8,049,418 B2 * | 11/2011 | Yamazaki | H10K 59/35 |
| | | | 313/506 |
| 9,859,354 B2 | 1/2018 | Kang et al. | |
| 10,840,315 B2 | 11/2020 | Lee | |
| 2018/0159072 A1 * | 6/2018 | Kim | H10K 71/00 |
| 2019/0267433 A1 * | 8/2019 | An | H10K 59/873 |
| 2020/0058901 A1 | 2/2020 | Choi et al. | |
| 2021/0202626 A1 * | 7/2021 | Jeon | H10K 71/00 |
| 2022/0085340 A1 * | 3/2022 | Lee | H10K 59/8792 |

FOREIGN PATENT DOCUMENTS

| | | |
|---|---|---|
| KR | 10-2016-0130071 | 11/2016 |
| KR | 10-1780009 | 2/2017 |
| KR | 10-2020-0039902 | 4/2020 |

* cited by examiner

*Primary Examiner* — Thao P Le
(74) *Attorney, Agent, or Firm* — KILE PARK REED & HOUTTEMAN PLLC

(57) ABSTRACT

A display apparatus for improving a reflective color sense includes a thin film transistor disposed over a substrate, a planarization layer disposed over the thin film transistor, a pixel electrode disposed over the planarization layer and electrically connected to the thin film transistor through a contact hole provided in the planarization layer, a pixel definition layer covering an edge of the pixel electrode to expose a center portion of the pixel electrode, and a bank arranged apart from the pixel defining layer and disposed over an area of a portion of the pixel electrode exposed by the pixel definition layer, the bank overlapping the contact hole when viewed in a direction perpendicular to the substrate.

21 Claims, 11 Drawing Sheets

DISPLAY APPARATUS

CROSS-REFERENCE TO RELATED APPLICATION

This application claims priority from and the benefit of Korean Patent Application No. 10-2021-0040505, filed on Mar. 29, 2021, which is hereby incorporated by reference for all purposes as if fully set forth herein.

BACKGROUND

Field

Embodiments of the invention relate generally to display apparatuses, and more specifically, to display apparatuses for improving a reflective color sense.

Discussion of the Background

Display apparatuses are electronic apparatuses capable of providing information to users. Such display apparatuses are becoming thinner and lighter, thus increasing user convenience.

The above information disclosed in this Background section is only for understanding of the background of the inventive concepts, and, therefore, it may contain information that does not constitute prior art.

SUMMARY

Devices constructed according to illustrative implementations of the invention are capable of having improved visibility due to lessening reflection of external light.

That is, such display apparatuses of the related art have a problem in that the visibility thereof is degraded due to the reflection of external light.

In order to solve various problems including the above problem, one or more embodiments include a display apparatus for improving a reflective color sense. However, these problems are merely examples and the scope of the inventive concepts is not limited thereto.

Additional features of the inventive concepts will be set forth in the description which follows, and in part will be apparent from the description, or may be learned by practice of the inventive concepts.

According to one or more embodiments, a display apparatus includes a thin film transistor disposed over a substrate, a planarization layer disposed over the thin film transistor, a pixel electrode disposed over the planarization layer and electrically connected to the thin film transistor through a contact hole defined in the planarization layer, a pixel definition layer covering an edge of the pixel electrode to expose a center portion of the pixel electrode, and a bank arranged apart from the pixel definition layer and disposed over an area of a portion of the pixel electrode exposed by the pixel definition layer, the bank overlapping the contact hole when viewed in a direction perpendicular to the substrate.

The contact hole may be arranged at a center portion of a portion of the pixel electrode exposed by the pixel definition layer.

An inclination direction of an upper surface of the planarization layer inclined with respect to the substrate on one side of the contact hole may be opposite to an inclination direction of the upper surface of the planarization layer with respect to the substrate on another side of the contact hole.

A thickness of a portion of the planarization layer under the pixel definition layer may be greater than a thickness of another portion of the planarization layer under the bank.

A thickness of a portion of the pixel electrode under the pixel definition layer may be greater than a thickness of another portion of the pixel electrode under the bank.

An area of the bank may be greater than an area of the contact hole when viewed in the direction perpendicular to the substrate.

The display apparatus may further include an opposite electrode integrally formed as a single body and disposed over the pixel definition layer and the bank.

The display apparatus may further include a light blocking layer disposed above the pixel definition layer and including an opening overlapping a portion of the pixel electrode exposed by the pixel definition layer when viewed in the direction perpendicular to the substrate, and a bank light blocking layer disposed above the bank and overlapping the bank when viewed in the direction perpendicular to the substrate.

The bank light blocking layer may include a material absorbing visible light.

According to one or more embodiments, a display apparatus includes a first thin film transistor and a second thin film transistor disposed over a substrate, a planarization layer disposed over the first thin film transistor and the second thin film transistor, a first pixel electrode disposed over the planarization layer and electrically connected to the first thin film transistor through a first contact hole defined in the planarization layer, a second pixel electrode disposed over the planarization layer and electrically connected to the second thin film transistor through a second contact hole defined in the planarization layer, a pixel definition layer covering an edge of the first pixel electrode, an edge of the second pixel electrode, and a portion of the second pixel electrode overlapping the second contact hole to expose a portion of the first pixel electrode overlapping the first contact hole, a center portion of the first pixel electrode, and a center portion of the second pixel electrode, and a bank arranged apart from the pixel definition layer and disposed over an area of a portion of the first pixel electrode exposed by the pixel definition layer, the bank overlapping the first contact hole when viewed in a direction perpendicular to the substrate.

The first contact hole may be arranged at a center portion of a portion of the first pixel electrode exposed by the pixel definition layer.

An inclination direction of an upper surface of the planarization layer with respect to the substrate on one side of the first contact hole may be opposite to an inclination direction of the upper surface of the planarization layer with respect to the substrate on another side of the first contact hole.

A thickness of a portion of the planarization layer under the pixel definition layer may be greater than a thickness of another portion of the planarization layer under the bank.

A thickness of a portion of the first pixel electrode under the pixel definition layer may be greater than a thickness of another portion of the first pixel electrode under the bank.

A thickness of the second pixel electrode may be uniform.

An area of the bank may be greater than an area of the first contact hole when viewed in the direction perpendicular to the substrate.

The display apparatus may further include an opposite electrode integrally formed as a single body and disposed over the pixel definition layer and the bank.

The display apparatus may further include a first emission layer disposed over the first pixel electrode, and a second emission layer disposed over the second pixel electrode and emitting light of a color different from a color of light emitted by the first emission layer.

The display apparatus may further include a light blocking layer disposed above the pixel definition layer and including openings overlapping portions of the first pixel electrode and the second pixel electrode exposed by the pixel definition layer when viewed in the direction perpendicular to the substrate, and a bank light blocking layer disposed above the bank and overlapping the bank when viewed in the direction perpendicular to the substrate.

The bank light blocking layer may include a material absorbing visible light.

The display apparatus may further include a first color filter filling the opening of the light blocking layer corresponding to the first pixel electrode and a second color filter filling the opening of the light blocking layer corresponding to the second pixel electrode, wherein the color filter may overlap a portion of the first pixel electrode exposed by the pixel definition layer, and the second color filter may overlap a portion of the second pixel electrode exposed by the pixel definition layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
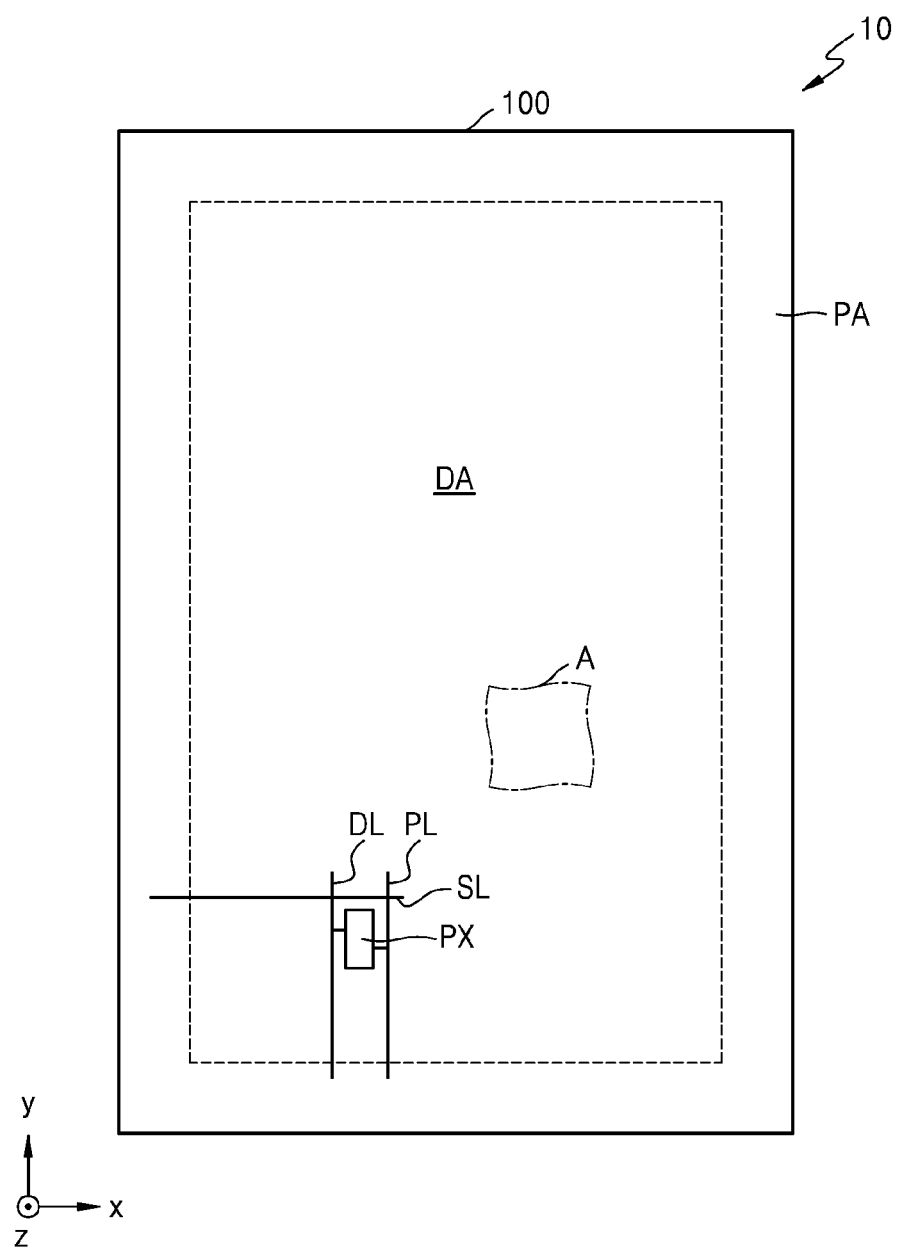
FIG. 1 is a plan view schematically illustrating a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, the x-axis, the y-axis, and the z-axis may be perpendicular to one another, or may represent different directions that are not perpendicular to one another (e.g., substantially perpendicular to one another). For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view schematically illustrating a display apparatus according to an embodiment that is constructed according to principles of the invention. As illustrated in FIG. 1, the display apparatus according to the embodiment described herein may include a display panel 10. The display apparatus may be of any type as long as it includes the display panel 10. For example, the display apparatus may be any one of various display apparatuses such as smartphones, tablets, laptops, televisions, or billboards.

The display panel 10 may include a display area DA and a peripheral area PA located outside the display area DA. FIG. 1 illustrates that the display area DA has a rectangular shape. However, the embodiment described herein is not limited thereto. For example, the display area DA may have various shapes such as circular shapes, elliptical shapes, polygonal shapes, or particular figure shapes.

The display area DA may be an area for displaying an image, and a plurality of subpixels PX may be arranged in the display area DA. Each subpixel PX may include a display device such as an organic light emitting diode OLED (see FIG. 3). That is, the display apparatus according to the embodiment described herein may be an organic light emitting display apparatus. Each subpixel PX may emit, for example, red, green, blue, or white light. Each subpixel PX may be connected to a pixel circuit including a thin film transistor, a storage capacitor, and/or the like. The pixel circuit may be connected to a plurality of scan lines SL configured to transmit a scan signal, data lines DL intersecting with the scan lines SL and configured to transmit a data signal, and driving voltage lines PL configured to supply a driving voltage. The scan lines SL may extend in the x direction, and the data lines DL and the driving voltage lines PL may extend in the y direction.

The subpixels PX may emit light as the pixel circuit is driven. The display area DA may provide a certain image through the light emitted from the subpixels PX. Herein, the subpixel PX may be defined as an emission area emitting any one of red light, green light, blue light, and white light as described above.

The peripheral area PA may be an area in which subpixels PX are not arranged and may be an area that does not provide an image. A printed circuit board including a power supply line and a driving circuit unit for driving the subpixels PX, a terminal unit to which a driver IC is connected, and/or the like may be arranged in the peripheral area PA.

Also, because the display panel 10 includes a substrate 100, the substrate 100 may be said to include the display area DA and the peripheral area PA. Hereinafter, for sake of convenience, it will be described that the substrate 100 includes the display area DA and the peripheral area PA.

Hereinafter, as a display apparatus according to an embodiment, an organic light emitting display apparatus will be described as an example. However, the display apparatus of the embodiment described herein is not limited thereto. For example, the display apparatus of the embodiment described herein may be a display apparatus such as an inorganic light emitting display apparatus (or inorganic EL display apparatus) or a quantum dot light emitting display apparatus. For example, an emission layer included in the display device provided in the display apparatus may include an organic material or an inorganic material. Also, quantum dots may be located on a path of light emitted from the emission layer.

Figure 2:
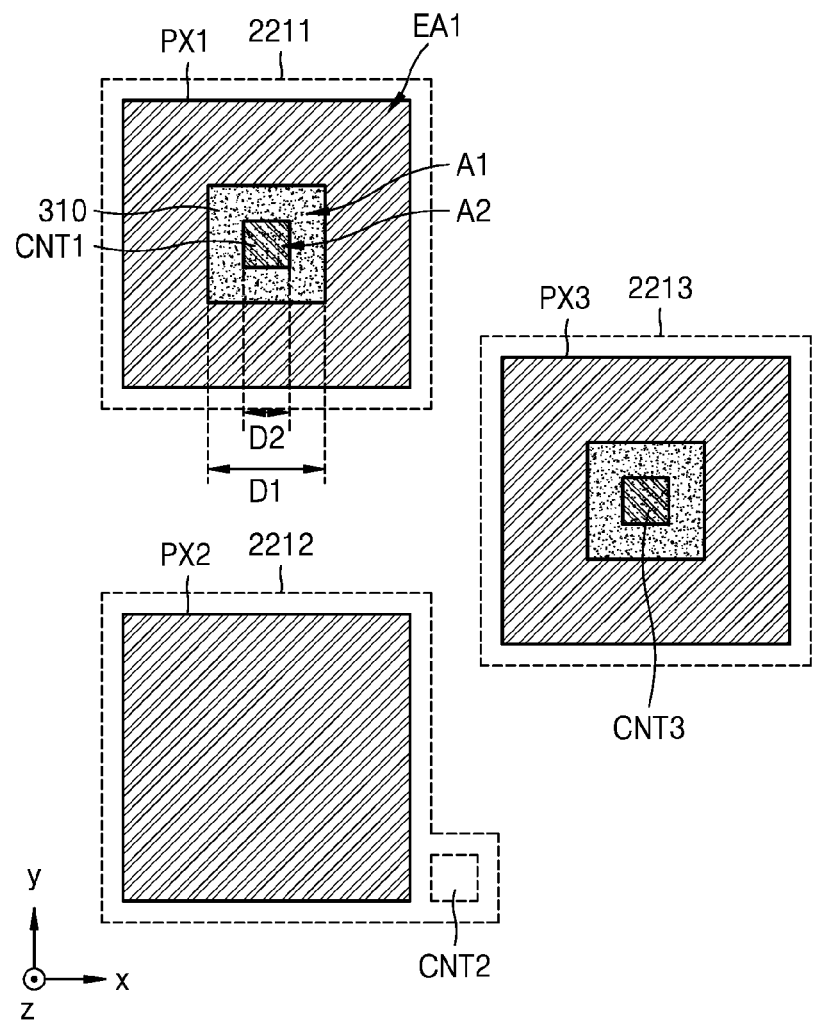
FIG. 2 is an enlarged plan view illustrating a portion of the display apparatus of FIG. 1.
Figure 3:
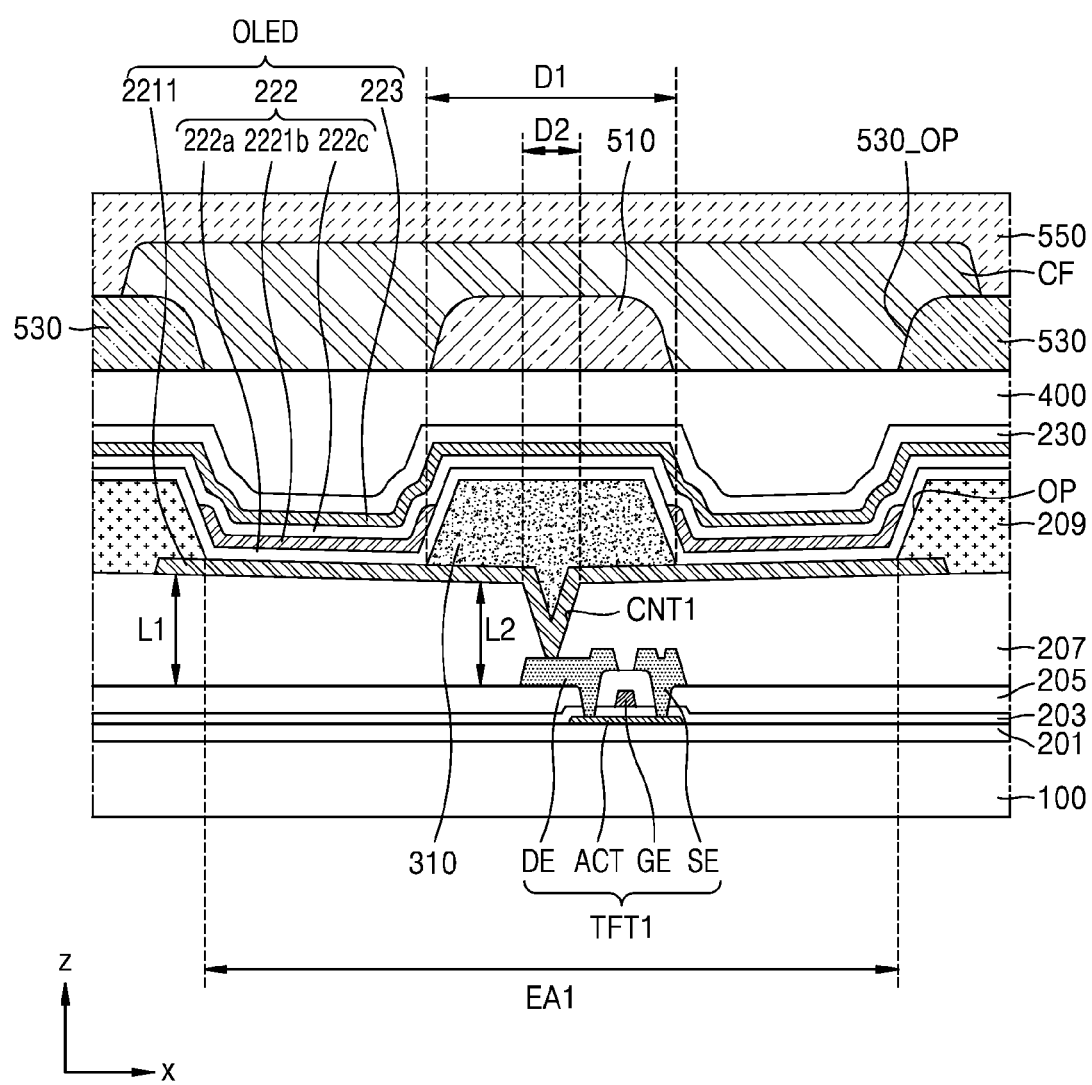
FIG. 3 is a cross-sectional view schematically illustrating a portion of the display apparatus of FIG. 2.

FIG. 2 is an enlarged plan view illustrating a portion of the display apparatus of FIG. 1. FIG. 2 may be an enlarged plan view illustrating a configuration of an embodiment that may be included in an area A of the display apparatus of FIG. 1. FIG. 3 is a cross-sectional view schematically illustrating a portion of the display apparatus of FIG. 2. FIG. 3 may be a cross-sectional view of the display apparatus taken along the center of a first subpixel PX1 of FIG. 2.

As illustrated in FIG. 2, the display apparatus may include a plurality of subpixels PX1, PX2, and PX3. The subpixels PX1, PX2, and PX3 may be a first subpixel PX1, a second subpixel PX2, and a third subpixel PX3 that emit light of different colors. The first subpixel PX1 may emit blue light, the second subpixel PX2 may emit green light, and the third subpixel PX3 may emit red light. However, the embodiment described herein is not limited thereto. For example, the first subpixel PX1 may emit green light, the second subpixel PX2 may emit red light, and the third subpixel PX3 may emit blue light. The first subpixel PX1, the second subpixel PX2, and the third subpixel PX3 may be arranged in various forms such as stripe arrangement, Pentile® arrangement, and mosaic arrangement to implement an image.

The first subpixel PX1, the second subpixel PX2, and the third subpixel PX3 may have a tetragonal shape among polygonal shapes when viewed in the z-axis direction. However, the embodiment described herein is not limited thereto. For example, the first subpixel PX1, the second subpixel PX2, and the third subpixel PX3 may have a circular or elliptical shape.

FIG. 2 illustrates that the first subpixel PX1, the second subpixel PX2, and the third subpixel PX3 have the same size. However, the embodiment described herein is not limited thereto. The first subpixel PX1, the second subpixel PX2, and the third subpixel PX3 may have different sizes. For example, the size of the third subpixel PX3 may be greater than the size of the first subpixel PX1 and the second subpixel PX2.

Herein, the size of the first subpixel PX1, the second subpixel PX2, and the third subpixel PX3 may represent the size of emission areas of display devices implementing the first subpixel PX1, the second subpixel PX2, and the third subpixel PX3. For example, a first emission area EA1 of the first subpixel PX1 may be defined by an opening OP (see FIG. 3) of a pixel definition layer 209 (see FIG. 3).

As illustrated in FIG. 3 that is a cross-sectional view schematically illustrating a portion of a display apparatus according to an embodiment, the display apparatus according to an embodiment may include an organic light emitting diode OLED disposed over a substrate 100 and may have a structure in which a buffer layer 201, a gate insulating layer 203, an interlayer insulating layer 205, a planarization layer 207, a pixel definition layer 209, a capping layer 230, a thin film encapsulation layer 400, a light blocking layer 530, and a color filter CF are stacked over the substrate 100 in that order.

The substrate 100 may include glass, metal, or polymer resin. When at least a portion of the display apparatus is bendable or the display apparatus is flexible, the substrate 100 may need to be flexible or bendable. In this case, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Also, the substrate 100 may be variously modified such as having a multilayer structure including two layers each including the above polymer resin and a barrier layer arranged between the two layers and including an inorganic material (e.g., silicon oxide, silicon nitride, or silicon oxynitride). Furthermore, when the substrate 100 is not bendable, the substrate 100 may include glass and the like.

The buffer layer 201 may be located over the substrate 100 to reduce or block the penetration of foreign materials, moisture, or external air from under the substrate 100 and may provide a flat surface over the substrate 100. The buffer layer 201 may include an inorganic material such as oxide or nitride, an organic material, or an organic/inorganic composite and may include a single-layer or multiple-layer structure of an inorganic material and an organic material. A barrier layer for blocking the penetration of external air may be further included between the substrate 100 and the buffer layer 201. The buffer layer 201 may include silicon oxide ($SiO_2$) or silicon nitride ($SiN_x$).

A first thin film transistor TFT1 may be disposed over the buffer layer 201. The first thin film transistor TFT1 may include a semiconductor layer ACT, a gate electrode GE, a source electrode SE, and a drain electrode DE. The first thin film transistor TFT1 may be connected to the organic light emitting diode OLED to drive the organic light emitting diode OLED.

The semiconductor layer ACT may be disposed over the buffer layer 201 and may include polysilicon. In other embodiments, the semiconductor layer ACT may include amorphous silicon. In other embodiments, the semiconductor layer ACT may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer ACT may include a channel area, and a source area and a drain area that are doped with dopants.

The gate electrode GE, the source electrode SE, and the drain electrode DE may be formed of various conductive materials. The gate electrode GE may include at least one of molybdenum, aluminum, copper, and titanium. For example, the gate electrode GE may have a single layer of molybdenum or may have a three-layer structure including a molybdenum layer, an aluminum layer, and a molybdenum layer. The source electrode SE and the drain electrode DE may include at least one of copper, titanium, and aluminum. For example, the source electrode SE and the drain electrode DE may have a three-layer structure including a titanium layer, an aluminum layer, and a titanium layer.

Moreover, in order to secure the insulation between the semiconductor layer ACT and the gate electrode GE, a gate insulating layer 203 including an inorganic material such as silicon oxide, silicon nitride, and/or silicon oxynitride may be disposed between the semiconductor layer ACT and the gate electrode GE. In addition, an interlayer insulating layer 205 including an inorganic material such as silicon oxide, silicon nitride, and/or silicon oxynitride may be disposed over the gate electrode GE, and the source electrode SE and the drain electrode DE may be disposed over the interlayer insulating layer 205. As such, an insulating layer including an inorganic material may be formed through chemical vapor deposition (CVD) or atomic layer deposition (ALD). This may also apply to the following embodiments and modifications thereof.

A planarization layer 207 may be disposed over the first thin film transistor TFT1. In order to provide a flat upper surface, chemical mechanical polishing may be performed on the upper surface of the planarization layer 207 after the planarization layer 207 is formed. The planarization layer 207 may be formed of, for example, an organic material such as acryl, benzocyclobutene (BCB), or hexamethyldisiloxane (HMDSO). Although FIG. 3 illustrates that the planarization layer 207 is a single layer, the planarization layer 207 may be a multilayer. The planarization layer 207 may define a first contact hole CNT1 exposing a portion of the drain electrode DE of the first thin film transistor TFT1. A first pixel electrode 2211 described below may be electrically connected to the first thin film transistor TFT1 through the first contact hole CNT1.

The first pixel electrode 2211 may be disposed over the planarization layer 207. The first pixel electrode 2211 located at the first subpixel PX1 may be arranged apart from the pixel electrode corresponding to each of the adjacent subpixels. That is, in a plurality of subpixels, pixel electrodes may be arranged apart from each other. The first pixel electrode 2211 may be disposed over the planarization layer 207 and may be electrically connected to the first thin film transistor TFT1 through the first contact hole CNT1 of the planarization layer 207.

The first pixel electrode 2211 may be a reflection electrode. In this case, the first pixel electrode 2211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof, and a transparent or semitransparent conductive layer formed over the reflection layer. The transparent or semitransparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO). For example, the first pixel electrode 2211 may have a stack structure of ITO/Ag/ITO.

A pixel definition layer 209 may be disposed over the first pixel electrode 2211. The pixel definition layer 209 may be formed of, for example, an organic material such as polyimide or hexamethyldisiloxane (HMDSO). The pixel definition layer 209 may cover an edge of the first pixel electrode 2211 to expose a center portion of the first pixel electrode 2211 including a portion of the first pixel electrode 2211 overlapping the first contact hole CNT1. The pixel definition layer 209 may cover the edge of the first pixel electrode 2211 to increase the distance between the edge of the first pixel electrode 2211 and an opposite electrode 223 to prevent an arc or the like from occurring at the edge of the first pixel electrode 2211. A first emission area EA1 may be defined by the pixel definition layer 209. The first emission area EA1 may be an area of the first pixel electrode 2211 that is not covered by the pixel definition layer 209.

In some embodiments, the pixel definition layer 209 may include a light blocking material. The light blocking material may include, for example, a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). By arranging the pixel definition layer 209 including the light blocking material, the reflection of external light by metal structures disposed under the pixel definition layer 209 may be reduced.

A bank 310 arranged apart from the pixel definition layer 209 and covering a portion of the first pixel electrode 2211 overlapping the first contact hole CNT1 may be disposed over the first pixel electrode 2211. As illustrated in FIGS. 2 and 3, a first contact hole CNT1 may be located in the first emission area EA1, and the first pixel electrode 2211 may be arranged to fill the first contact hole CNT1. Accordingly, the shape of the upper surface of the first pixel electrode 2211 at a portion thereof over the first contact hole CNT1 may be different from the shape of the upper surface of the first pixel electrode 2211 at other portions thereof. Accordingly, when a bank 310 covering a portion of the first pixel electrode 2211 over the first contact hole CNT1 is not provided, the luminance at a portion corresponding to the first contact hole CNT1 in the first emission layer 2221b located over the first pixel electrode 2211 may be different from the luminance of the first emission layer 2221b at other portions thereof. As such, the bank 310 may cover a portion that may cause nonuniform luminance, to uniformly emit light in the first emission area EA1.

As illustrated in FIG. 2, in the view in the direction perpendicular to the substrate 100 (e.g., the z-axis direction), an area A1 of the bank 310 may be greater than an area A2 of the first contact hole CNT1. The width of the bank 310 in one direction (e.g., the x-axis direction) may be referred to as a first width D1, and the width of the first contact hole CNT1 in one direction (e.g., the x-axis direction) may be referred to as a second width D2. In order for the bank 310 to cover an area where the first contact hole CNT1 is defined, the first width D1 may be greater than the second width D2. Thus, the area A1 of the bank 310 may be greater than the area A2 of the first contact hole CNT1. For example, the first width D1 may be about 16.9 μm and the second width D2 may be about 5.5 μm. However, the embodiment described herein is not limited thereto. For example, the first width D1 may correspond to the second width D2, or the first width D1 may be less than the second width D2.

Moreover, as illustrated in FIG. 2, in the first subpixel PX1 and the third subpixel PX3, the first contact hole CNT1 corresponding to the first pixel electrode 2211 may be located at a substantially center portion of the first pixel electrode 2211 and a third contact hole CNT3 corresponding to a third pixel electrode 2213 may be located at a substantially center portion of the third pixel electrode 2213. The pixel definition layer 209 may cover the edge of the first pixel electrode 2211 and the edge of the third pixel electrode 2213, and thus the first contact hole CNT1 corresponding to the first pixel electrode 2211 and the third contact hole CNT3 corresponding to the third pixel electrode 2213 may not be covered by the pixel definition layer 209. However, in the second subpixel PX2, a second pixel electrode 2212 may have a protrusion portion on one side thereof and a second contact hole CNT2 may be located at the protrusion portion, and the pixel definition layer 209 may cover the second contact hole CNT2 while covering the edge of the second pixel electrode 2212. That is, in the view in the direction perpendicular to the substrate 100 (the z-axis direction), the first contact hole CNT1 in the first subpixel PX1 and the third contact hole CNT3 in the third subpixel PX3 may not overlap the pixel definition layer 209, and the second contact hole CNT2 of the second subpixel PX2 may overlap the pixel definition layer 209.

However, the embodiment described herein is not limited thereto. For example, also in the second subpixel PX2, the pixel definition layer 209 may not cover the second contact hole CNT2 corresponding to the second pixel electrode 2212 when necessary. Alternatively, the second subpixel PX2 may also have the same or similar structure as the first subpixel PX1, and thus, the second contact hole CNT2 corresponding to the second pixel electrode 2212 may be located at a substantially center portion of the second pixel electrode 2212, the pixel definition layer 209 may cover the edge of the second pixel electrode 2212, and the second contact hole CNT2 of the second pixel electrode 2212 may not be covered by the pixel definition layer 209.

The bank 310 may include the same material as the pixel definition layer 209. For example, the bank 310 may be simultaneously formed of the same material as the pixel definition layer 209. Thus, the bank 310 of the display apparatus according to an embodiment may include a light blocking material. The light blocking material may include, for example, a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). By arranging the bank 310 including the light blocking material, the reflection of external light by metal structures disposed under the bank 310 may be reduced.

As illustrated in FIG. 3, the first contact hole CNT1 may be arranged at a center portion of an area of the first pixel electrode 2211 that is not covered by the pixel definition layer 209. That is, the first contact hole CNT1 may be arranged at a center portion of the first emission area EA1. In this case, the inclination direction of the upper surface of the planarization layer 207 with respect to the substrate 100 on one side (−X direction) of the first contact hole CNT1 may be opposite to the inclination direction of the upper surface of the planarization layer 207 with respect to the substrate 100 on the other side (+X direction) of the first contact hole CNT1. FIG. 3 illustrates that the thickness of the planarization layer 207 decreases toward the first contact hole CNT1 on one side (−X direction) of the first contact hole CNT1 and the thickness of the planarization layer 207 decreases toward the first contact hole CNT1 on the other side (+X direction) of the first contact hole CNT1. The embodiment described herein is not limited thereto, and when necessary, with respect to the first contact hole CNT1, the shape of the upper surface of the planarization layer 207 inclined with respect to the substrate 100 on one side (−X direction) of the first contact hole CNT1 may be symmetrical to the shape of the upper surface of the planarization layer 207 inclined with respect to the substrate 100 on the other side (+X direction) of the first contact hole CNT1.

As the planarization layer 207 has such a shape, the upper surface of the first pixel electrode 2211 disposed over the planarization layer 207 may also have a shape corresponding to the upper surface of the planarization layer 207. That is, the inclination direction of the upper surface of the first pixel electrode 2211 with respect to the substrate 100 on one side (−X direction) of the first contact hole CNT1 may be opposite to the inclination direction of the upper surface of the first pixel electrode 2211 with respect to the substrate 100 on the other side (+X direction) of the first contact hole CNT1. FIG. 3 illustrates that the distance from the upper surface of the substrate 100 to the upper surface of the first pixel electrode 2211 decreases toward the first contact hole CNT1 on one side (−X direction) of the first contact hole CNT1 and the distance from the upper surface of the substrate 100 to the upper surface of the first pixel electrode 2211 decreases toward the first contact hole CNT1 on the other side (+X direction) of the first contact hole CNT1. The embodiment described herein is not limited thereto, and when necessary, with respect to the first contact hole CNT1, the shape of the upper surface of the first pixel electrode 2211 inclined with respect to the substrate 100 on one side (−X direction) of the first contact hole CNT1 may be symmetrical to the shape of the upper surface of the first pixel electrode 2211 inclined with respect to the substrate 100 on the other side (+X direction) of the first contact hole CNT1.

In this structure, a thickness L1 of a portion of the planarization layer 207 under the pixel definition layer 209 may be greater than a thickness L2 of another portion of the planarization layer 207 under the bank 310. Also, the upper surface of the first pixel electrode 2211 disposed over the planarization layer 207 may have a shape in which a portion over the first contact hole CNT1 arranged at a center portion of the first emission area EA1 is concave toward the substrate 100.

An intermediate layer 222 may be disposed over the first pixel electrode 2211 and the pixel definition layer 209. The intermediate layer 222 may include a first common layer 222a, a first emission layer 2221b, and a second common layer 222c.

The first emission layer 2221b may be disposed inside an opening OP of the pixel definition layer 209. The first emission layer 2221b may include an organic material including a fluorescent or phosphorescent material capable of emitting blue, green, or red light. The above organic material may include a low-molecular weight organic material or a high-molecular weight organic material. FIG. 3 illustrates that the first emission layer 2221b is located over a portion of the first pixel electrode 2211 exposed by the pixel definition layer 209 and the bank 310. However, the embodiment described herein is not limited thereto. The first emission layer 2221b may be disposed inside the opening OP of the pixel definition layer 209 and may be integrally formed as a single body over the first pixel electrode 2211 and the bank 310. That is, the first emission layer 2221b may be disposed to cover the bank 310.

A first common layer 222a and a second common layer 222c may be disposed under and over the first emission layer 2221b, respectively. The first common layer 222a may include, for example, a hole transport layer (HTL) or may include an HTL and a hole injection layer (HIL). The second common layer 222c may include, for example, an electron transport layer (ETL) or may include an ETL and an electron injection layer (EIL). In some embodiments, the second common layer 222c may be omitted.

While the first emission layer 2221b is arranged to correspond to the opening OP of the pixel definition layer 209, the first common layer 222a and the second common layer 222c may be integrally formed as a single body to entirely cover the substrate 100. That is, each of the first common layer 222a and the second common layer 222c may be integrally formed as a single body to entirely cover the display area DA of the substrate 100.

The opposite electrode 223 may be a cathode. The opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer such as ITO, IZO, ZnO, or $In_2O_3$ over the (semi)transparent layer including the above material. The organic light emitting diode OLED may include the layers from the first pixel electrode 2211 to the opposite electrode 223. The opposite electrode 223 may be integrally formed as a single body disposed over the pixel definition layer 209 and the bank 310. That is, the opposite electrode 223 may be disposed to cover the pixel definition layer 209 and the bank 310.

In an embodiment, the display apparatus may further include a capping layer 230 disposed over the organic light emitting diode OLED. The capping layer 230 may function to improve the light emission efficiency of the organic light emitting diode OLED according to the principle of constructive interference. The capping layer 230 may include, for example, a material exhibiting a refractive index of about 1.6 or more with respect to light having a wavelength of about 589 nm.

The capping layer 230 may be an organic capping layer including an organic material, an inorganic capping layer including an inorganic material, or a composite capping layer including an organic material and an inorganic material. For example, the capping layer 230 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may be selectively substituted with a substituent including O, N, S, Se, Si, F, Cl, Br, I, or any combination thereof.

A thin film encapsulation layer 400 may be disposed over the capping layer 230. The thin film encapsulation layer 400 may have a multilayer structure including at least one inorganic encapsulation layer and at least one organic encapsulation layer. The inorganic encapsulation layer may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer may include a polymer-based material. The polymer-based material may include polyethyleneterephthalate, polyethylenenaphthalate, polycarbonate, polyimide, polyethylenesulfonate, polyoxymethylene, polyarylate, hexamethyldisiloxane, acrylic resin (e.g., polymethylmethacrylate or polyacrylic acid), or any combination thereof.

Even when a crack occur in the thin film encapsulation layer 400, the thin film encapsulation layer 400 may prevent the crack from being connected between the inorganic encapsulation layer and the organic encapsulation layer through the above multilayer structure. Accordingly, the formation of a path through which the moisture or oxygen from the outside penetrates into the display area DA may be prevented or minimized.

A light blocking layer 530 located above the pixel definition layer 209 and overlapping the pixel definition layer 209 in the view in the direction perpendicular to the substrate 100 (e.g., the z-axis direction) may be disposed over the thin film encapsulation layer 400. The light blocking layer 530 may include a light blocking layer opening 530_OP corresponding to the first subpixel PX1. That is, in the view in the direction perpendicular to the substrate 100 (e.g., the z-axis direction), the light blocking layer opening 530_OP may overlap a portion of the first pixel electrode 2211 exposed by the pixel definition layer 209. The light emitted from the display device may be emitted to the outside through the light blocking layer opening 530_OP. Because the light blocking layer 530 may overlap the pixel definition layer 209, the light blocking layer opening 530_OP may overlap the opening OP of the pixel definition layer 209. That is, the area of the light blocking layer opening 530_OP may be substantially equal to the area of the opening OP of the pixel definition layer 209 corresponding thereto.

The light blocking layer 530 may include a material absorbing visible light. That is, the light blocking layer 530 may include a material generally absorbing a wavelength of about 380 nm to about 780 nm. Thus, the light blocking layer 530 may have a color similar to gray or black. The light blocking layer 530 may include, for example, a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). The light blocking layer 530 may absorb external light incident on the display panel 10 and absorb reflected light reflected from the display panel 10, thus improving the visibility of the display apparatus.

A bank light blocking layer 510 disposed above the bank 310 and overlapping the bank 310 in the view in the direction perpendicular to the substrate 100 may be disposed over the thin film encapsulation layer 400. Because the bank 310 is arranged apart from the pixel definition layer 209, the bank light blocking layer 510 may be arranged apart from the light blocking layer 530. Also, the bank light blocking layer 510 may be arranged at a center portion of the first emission area EA1.

The bank light blocking layer 510 may include the same material as the light blocking layer 530. The bank light blocking layer 510 may include a material absorbing visible light. That is, the bank light blocking layer 510 may include a material generally absorbing a wavelength of about 380 nm to about 780 nm. Thus, the bank light blocking layer 510 may have a color similar to gray or black. The bank light blocking layer 510 may include, for example, a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). The bank light blocking layer 510 may be simultaneously formed in the same process as the light blocking layer 530.

Because a bank 310 is arranged at a center portion of the first emission area EA1 that is an area of the first pixel electrode 2211 that is not covered by the pixel definition layer 209 and an opposite electrode 223 is disposed over the bank 310, reflected light may occur due to the reflection of external light by the opposite electrode 223 over the bank 310. The bank light blocking layer 510 may absorb the reflected light. Accordingly, the visibility of the display apparatus may be improved.

A color filter CF may be disposed to fill the light blocking layer opening 530_OP of the light blocking layer 530. Because the bank light blocking layer 510 is located in the light blocking layer opening 530_OP, the color filter CF may fill a portion other than the bank light blocking layer 510 in the light blocking layer opening 530_OP. Also, as illustrated in FIG. 3, the color filter CF may be disposed over the light blocking layer 530 and may also be disposed over the bank light blocking layer 510. In the view in the direction perpendicular to the substrate 100 (e.g., the z-axis direction), the color filter CF may be disposed to cover the first emission area EA1 of the first subpixel PX1 corresponding thereto. That is, in the view in the direction perpendicular to the substrate 100, the area of the color filter CF may be greater than the area of the first emission area EA1 of the first subpixel PX1 corresponding to the color filter CF. Also, an end portion of the color filter CF may overlap the light blocking layer 530.

The color filter CF may be considered as being arranged to overlap the first emission layer 2221b included in the first subpixel PX1 corresponding thereto. In this case, the wavelength of light emitted by the first emission layer 2221b overlapping the color filter CF may belong to a wavelength band that the color filter CF passes. For example, when the first emission layer 2221b emits blue light, the color filter CF overlapping the first emission layer 2221b may pass the blue light and absorb light of different wavelength.

The color filter CF may reduce the external light reflectance. Particularly, the color filter CF may not absorb the light emitted from the first emission layer 2221b and may absorb light having a different color than the light emitted from the first emission layer 2221b among the reflected light reflected after entering the display apparatus from the outside. Accordingly, the color filter CF may reduce the external light reflectance. That is, the external light reflectance may be effectively reduced even when a linear polarization plate or a ¼ wavelength plate is not provided.

An overcoat layer 550 may be disposed over the color filter CF to cover the color filter CF and the light blocking layer 530. The overcoat layer 550 may protect the color filter CF. Also, the overcoat layer 550 may planarize a step caused by the color filter CF and the light blocking layer 530 or the like. By considering the light emission efficiency, the overcoat layer 550 may include a material having high light transmittance.

As described above, each of the plurality of subpixels may include a pixel electrode. The relative position relationship between a pixel electrode included in a subpixel and a line located thereunder may be different from the position relationship between a pixel electrode included in another subpixel and a line located thereunder. Thus, the inclination of a pixel electrode included in a subpixel with respect to the substrate 100 may be different from the inclination of a pixel electrode included in another subpixel with respect to the substrate 100. For example, the first pixel electrode 2211 included in the first subpixel PX1 may be inclined with respect to the substrate 100 such that an end portion in the −x direction may be more adjacent to the substrate 100 than an end portion in the +x direction, and the third pixel electrode 2213 included in the third subpixel PX3 may be inclined with respect to the substrate 100 such that an end portion in the +x direction may be more adjacent to the substrate 100 than an end portion in the −x direction.

In this structure, when external light is reflected after being incident on the first pixel electrode 2211 at a non-perpendicular angle, the degree to which the light reflected from the first pixel electrode 2211 of the first subpixel PX1 is blocked by the light blocking layer 530 and the degree to which the light reflected from the third pixel electrode 2213 of the third subpixel PX3 is blocked by the light blocking layer 530 may vary. When the amount of light passed through the light blocking layer 530 after being reflected from the first pixel electrode 2211 of the first subpixel PX1 is greater than the amount of light passed through the light blocking layer 530 after being reflected from the third pixel electrode 2213 of the third subpixel PX3, the user may relatively strongly recognize the color of light in the wavelength band passed through the color filter CF of the first subpixel PX1. Accordingly, the user may recognize a reflective color band or recognize a reflective color bleeding phenomenon in the display apparatus.

However, in the case of the display apparatus according to the embodiment described herein, the first pixel electrode 2211 may have a symmetrical structure as described above, thus preventing the formation of a reflective color band and a reflective color bleeding phenomenon and improving a reflective color sense. That is, as described above, the inclination of the upper surface of the first pixel electrode 2211 with respect to the substrate 100 may be substantially symmetrical with respect to the first contact hole CNT1 and the inclination of the upper surface of the third pixel electrode 2213 may be substantially symmetrical with respect to the third contact hole CNT3, thus preventing or minimizing the phenomenon of the above inclination direction varying in the first subpixel PX1 and the third subpixel PX3. Particularly, as described above, because all the upper surface of the first pixel electrode 2211 has a shape in which a portion over the first contact hole CNT1 arranged at a center portion of the first emission area EA1 is concave toward the substrate 100 in the first subpixel PX1 and all the upper surface of the third pixel electrode 2213 (see FIG. 7) has a shape in which a portion over the third contact hole CNT3 arranged at a center portion of a third emission area EA3 (see FIG. 7) is concave toward the substrate 100 in the third subpixel PX3 as in the first subpixel PX1, the shape of the upper surface of the third pixel electrode 2213 in the third subpixel PX3 may be substantially similar to the shape of the upper surface of the first pixel electrode 2211 in the first subpixel PX1.

Figure 4:
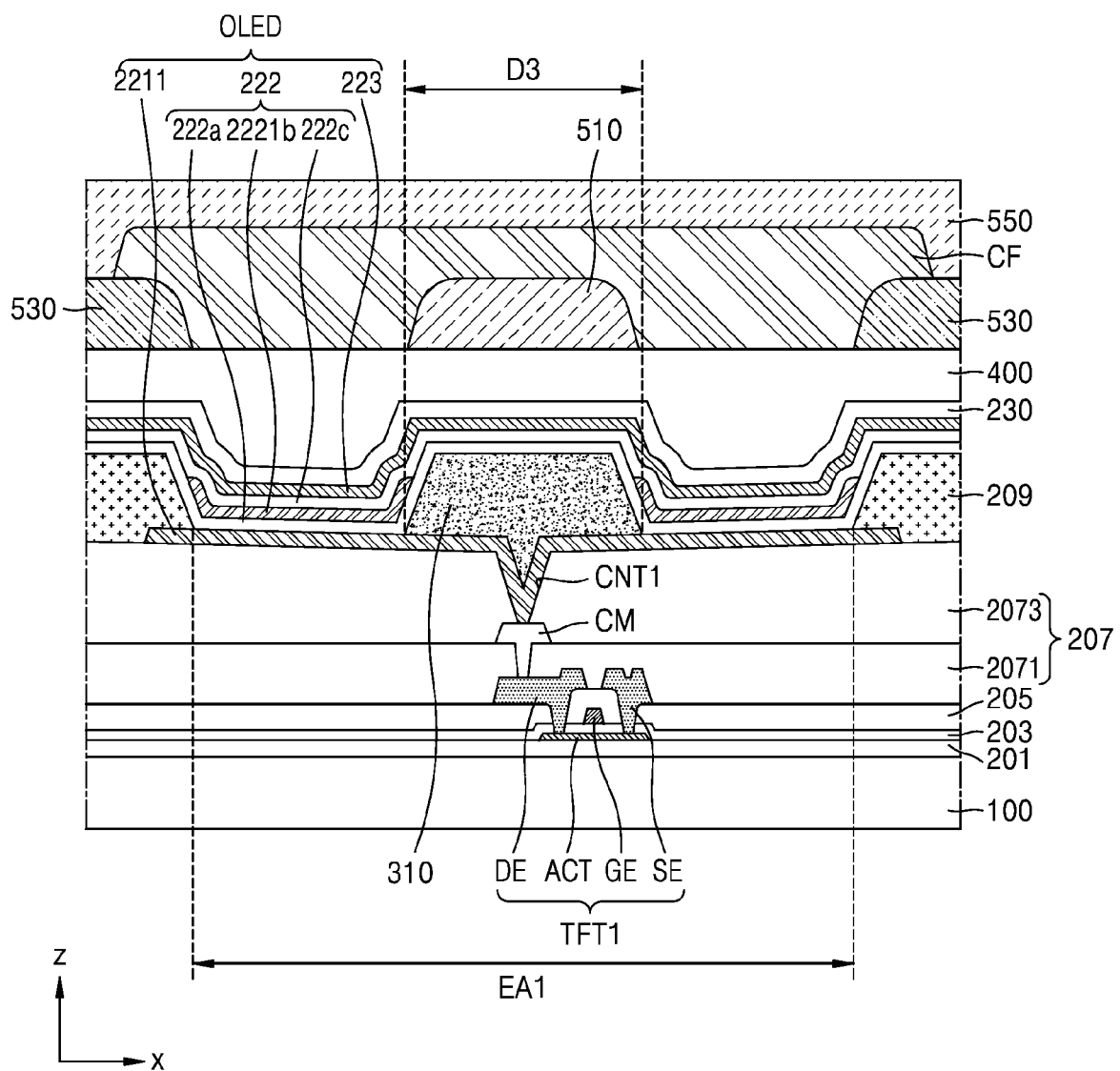
FIG. 4 is a cross-sectional view schematically illustrating a portion of a display apparatus according to another embodiment.

FIG. 4 is a cross-sectional view schematically illustrating a portion of a display apparatus according to another embodiment. In FIG. 4, like reference numerals as those in FIG. 3 denote like members, and thus, redundant descriptions thereof will be omitted for conciseness.

As illustrated in FIG. 4, a planarization layer 207 may be disposed over the first thin film transistor TFT1. The planarization layer 207 may include a first planarization layer 2071 and a second planarization layer 2073. The first planarization layer 2071 and the second planarization layer 2073 may be formed of, for example, an organic material such as acryl, benzocyclobutene (BCB), or hexamethyldisiloxane (HMDSO). In this case, because a line may be disposed between the first planarization layer 2071 and the second planarization layer 2073, a more complex line structure may be configured than in a case where the planarization layer 207 is a single layer.

The second planarization layer 2073 may include a first contact hole CNT1 exposing a portion of a connection electrode CM. A first pixel electrode 2211 may be electrically connected to the first thin film transistor TFT1 through the first contact hole CNT1 and the connection electrode CM.

The first pixel electrode 2211 may be disposed over the second planarization layer 2073. The first pixel electrode 2211 may be electrically connected to the first thin film transistor TFT1 through the first contact hole CNT1 of the second planarization layer 2073.

A bank 310 apart from the pixel definition layer 209 and covering a portion of the first pixel electrode 2211 overlapping the first contact hole CNT1 may be disposed over the first pixel electrode 2211. The width in one direction (e.g., the x-axis direction) of the bank 310 included in the display apparatus according to the embodiment described herein in which the planarization layer 207 includes two layers may be referred to as a third width D3. In this case, the third width D3 may be greater than the first width D1 and the second width D2 described above. For example, the first width D1 may be about 16.9 μm, the second width D2 may be about 5.5 μm, and the third width D3 may be about 22.9 μm.

Figure 5:
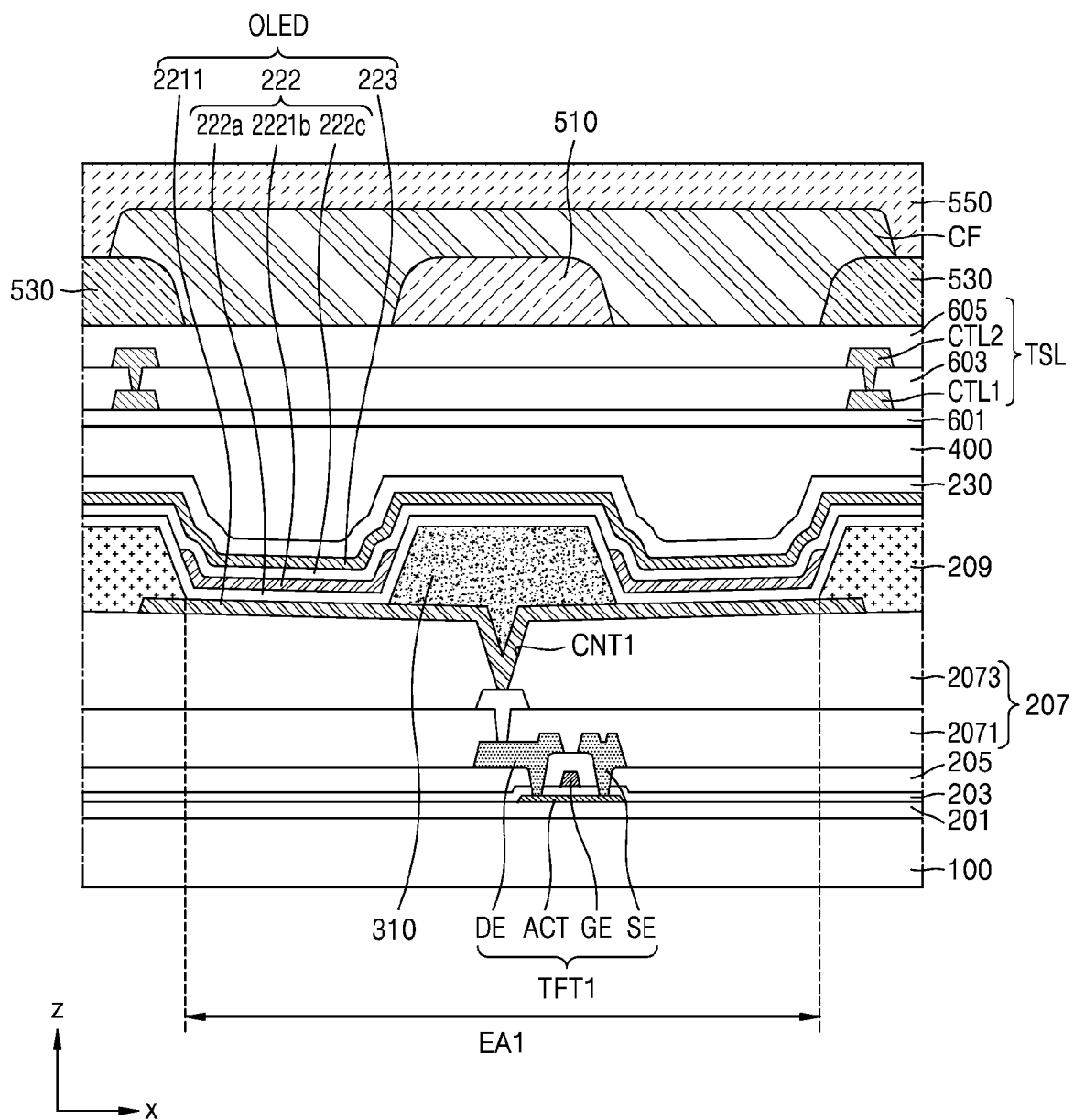
FIG. 5 is a cross-sectional view schematically illustrating a portion of a display apparatus according to another embodiment.

FIG. 5 is a cross-sectional view schematically illustrating a portion of a display apparatus according to another embodiment. In FIG. 5, like reference numerals as those in FIG. 3 and/or FIG. 4 denote like members, and thus, redundant descriptions thereof will be omitted for conciseness.

As illustrated in FIG. 5, the display apparatus according to other embodiments may further include a touch sensor layer TSL disposed between the pixel definition layer 209 and the bank light blocking layer 510. The touch sensor layer TSL may be a layer sensing a user's touch input. The touch sensor layer TSL may sense a user's touch input by using a resistive method, a capacitive method, or the like.

The touch sensor layer TSL may include a first sub conductive layer CTL1, a second sub conductive layer CTL2, a touch insulating layer 603, and a touch cover layer 605. In an embodiment, the touch sensor layer TSL may further include a touch buffer layer 601 disposed between the thin film encapsulation layer 400 and the touch insulating layer 603.

The touch buffer layer 601 may be disposed over the thin film encapsulation layer 400. The touch buffer layer 601 may prevent damage to the thin film encapsulation layer 400 and may block an interference signal that may occur when the touch sensor layer TSL is driven. The touch buffer layer 601 may include an organic material or an inorganic insulating material such as silicon oxide ($SiO_X$), silicon nitride ($SiN_X$), or silicon oxynitride ($SiO_XN_Y$). The touch buffer layer 601 may have a single-layer or multiple-layer structure including the above organic material or inorganic insulating material.

A first sub conductive layer CTL1, a touch insulating layer 603, a second sub conductive layer CTL2, and a touch cover layer 605 may be sequentially stacked over the touch buffer layer 601. The first sub conductive layer CTL1 and the second sub conductive layer CTL2 may be disposed under and over the touch insulating layer 603, respectively. The second sub conductive layer CTL2 may function as a sensor for sensing a user's touch input. The first sub conductive layer CTL1 may function as a connector for connecting the second sub conductive layer CTL2 patterned, in one direction. In some embodiments, both the first sub conductive layer CTL1 and the second sub conductive layer CTL2 may function as a sensor. In this case, the first sub conductive layer CTL1 and the second sub conductive layer CTL2 may be electrically connected through a contact hole. As such, because both the first sub conductive layer CTL1 and the second sub conductive layer CTL2 function as a sensor, the resistance of a touch electrode may be reduced and thus the user's touch input may be rapidly sensed. In some embodiments, the first sub conductive layer CTL1 and the second sub conductive layer CTL2 may have a mesh structure such that the light emitted from the organic light emitting diode OLED may pass therethrough. In this case, the first sub conductive layer CTL1 and the second sub conductive layer CTL2 may be arranged not to overlap an emission area of the organic light emitting diode OLED.

The first sub conductive layer CTL1 and the second sub conductive layer CTL2 may include a metal layer or a transparent conductive layer. The metal layer may include molybdenum (Mo), silver (Ag), titanium (Ti), copper (Cu), aluminum (Al), or any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as poly(3,4-ethylenedioxythiophene) (PEDOT), metal nanowire, carbon nanotube, graphene, or the like.

The touch insulating layer 603 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may include at least one of acryl-based resin, methacryl-based resin, polyisoprene, vinyl-based resin, epoxy-based resin, urethane-based resin, cellulose-based resin, and perylene-based resin. The touch cover layer 605 may entirely cover the second sub conductive layer CTL2 and the touch insulating layer 603 to protect the touch sensor layer TSL.

Figure 6:
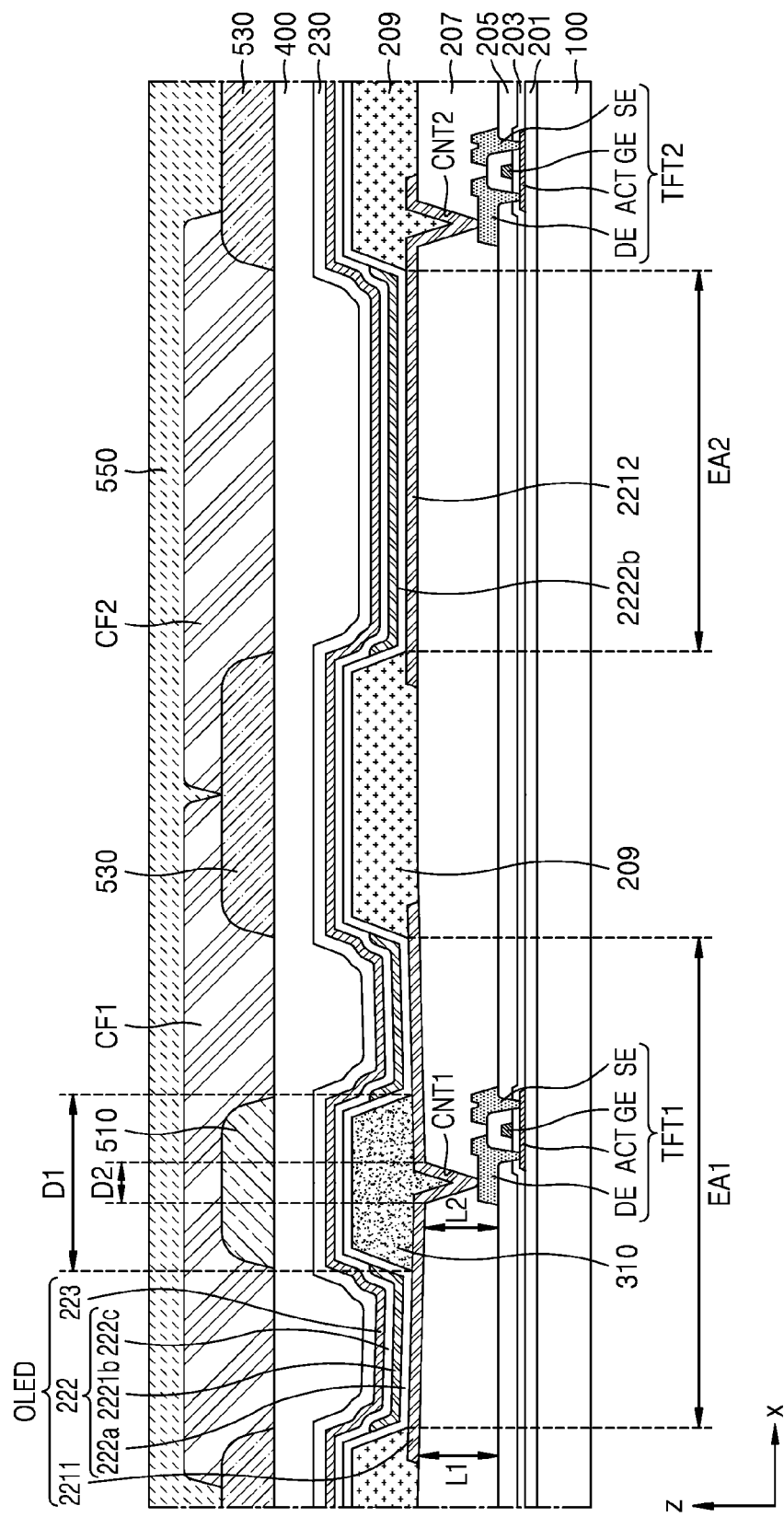
FIG. 6 is a cross-sectional view schematically illustrating a portion of a display apparatus according to another embodiment.
Figure 7:
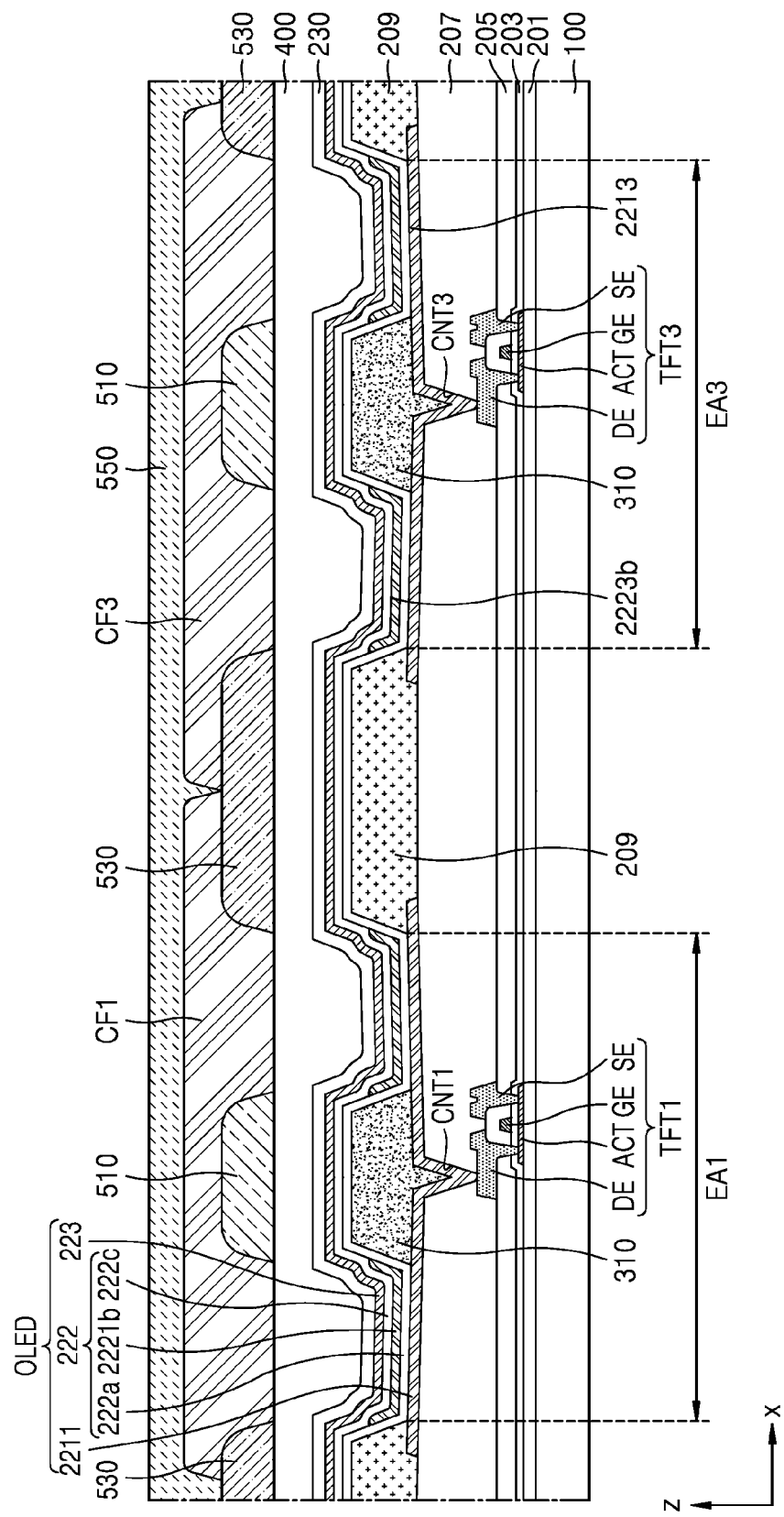
FIG. 7 is a cross-sectional view schematically illustrating a portion of a display apparatus according to another embodiment.

FIG. 6 is a cross-sectional view schematically illustrating a portion of a display apparatus according to another embodiment. FIG. 6 may be a cross-sectional view of the first subpixel PX1 and the second subpixel PX2. FIG. 7 is a cross-sectional view schematically illustrating a portion of a display apparatus according to another embodiment. FIG. 7 may be a cross-sectional view of the first subpixel PX1 and the third subpixel PX3. In FIGS. 6 and 7, like reference numerals as those in the foregoing drawings denote like members, and thus, redundant descriptions thereof will be omitted for conciseness.

As illustrated in FIG. 6, a first thin film transistor TFT1 and a second thin film transistor TFT2 may be disposed over the substrate 100. A planarization layer 207 may be disposed over the first thin film transistor TFT1 and the second thin film transistor TFT2. A first pixel electrode 2211 electrically connected to the first thin film transistor TFT1 through the first contact hole CNT1 of the planarization layer 207 and a second pixel electrode 2212 electrically connected to the second thin film transistor TFT2 through the second contact hole CNT2 of the planarization layer 207 may be disposed over the planarization layer 207. Over the planarization layer 207, a pixel definition layer 209 may be disposed to cover an edge of the first pixel electrode 2211, an edge of the second pixel electrode 2212, and a portion of the second pixel electrode 2212 overlapping the second contact hole CNT2 to expose a center portion of the first pixel electrode 2211 including a portion of the first pixel electrode 2211 overlapping the first contact hole CNT1, and a center portion of the second pixel electrode 2212.

The structure of the organic light emitting diode OLED driven by the first thin film transistor TFT1 may be the same as the structure of the organic light emitting diode OLED illustrated in FIG. 3. A bank 310 apart from the pixel definition layer 209 and covering a portion of the first pixel electrode 2211 overlapping the first contact hole CNT1 may be disposed over the first pixel electrode 2211. The first width D1 that is the width of the bank 310 in one direction (e.g., the x-axis direction) may be greater than the second width D2 that is the width of the first contact hole CNT1 in one direction (e.g., the x-axis direction). Thus, in the view in the direction perpendicular to the substrate 100, the area of the bank 310 may be greater than the area of the first contact hole CNT1.

The first contact hole CNT1 may be arranged at a center portion of an area of the first pixel electrode 2211 that is not covered by the pixel definition layer 209. The first emission area EA1 may be an area of the first pixel electrode 2211 that is not covered by the pixel definition layer 209. Thus, the first contact hole CNT1 may be considered as being arranged at a center portion of the first emission area EA1. The inclination of the upper surface of the planarization layer 207 with respect to the substrate 100 at a portion of the first pixel electrode 2211 exposed by the pixel definition layer 209 may be the same as that described above with reference to FIG. 3. For example, the inclination of the upper surface of the planarization layer 207 with respect to the substrate 100 at a portion of the first pixel electrode 2211 exposed by the pixel definition layer 209 may be symmetrical with respect to the first contact hole CNT1. Thus, the inclination of the first pixel electrode 2211 disposed over the planarization layer 207 with respect to the substrate 100 may also be symmetrical with respect to the first contact hole CNT1. Also, the thickness L1 of a portion of the planarization layer 207 under the pixel definition layer 209 may be greater than the thickness L2 of another portion of the planarization layer 207 under the bank 310. That is, the first pixel electrode 2211 disposed over the planarization layer 207 may be arranged to be inclined toward the first contact hole CNT1 arranged at a center portion of the first emission area EA1.

A first emission layer 2221b may be disposed over the first pixel electrode 2211. The first emission layer 2221b may include an organic material including a fluorescent or phosphorescent material capable of emitting blue, green, or red light. The opposite electrode 223 may be integrally formed as a single body over the pixel definition layer 209 and the bank 310.

A light blocking layer 530 overlapping the pixel definition layer 209 in the view in the direction perpendicular to the substrate 100 (e.g., the z-axis direction) may be disposed above the pixel definition layer 209. The light blocking layer 530 may include openings respectively corresponding to subpixels. That is, in the view in the direction perpendicular to the substrate 100 (e.g., the z-axis direction), the openings may overlap portions of the first pixel electrode 2211 and the second pixel electrode 2212 exposed by the pixel definition layer 209.

Also, a bank light blocking layer 510 may be disposed above the bank 310 to overlap the bank 310 when viewed in the direction perpendicular to the substrate 100 (e.g., the z-axis direction). The light blocking layer 530 and the bank light blocking layer 510 may include a material absorbing visible light. That is, the light blocking layer 530 and the bank light blocking layer 510 may include a material generally absorbing a wavelength of about 380 nm to about 780 nm. Thus, the bank light blocking layer 510 may absorb the reflected light reflected from the opposite electrode 223 over the bank 310.

The structure of the organic light emitting diode OLED driven by the second thin film transistor TFT2 may be the same as the structure of the organic light emitting diode OLED driven by the first thin film transistor TFT1. In the case of the organic light emitting diode OLED driven by the first thin film transistor TFT1, the reflective color sense may be improved by arranging the first contact hole CNT1 at a center portion of the first emission area EA1. However, the contact hole may not have to be located at a center portion of the emission area in all the subpixels. For example, as illustrated in FIG. 6, in the case of the organic light emitting diode OLED driven by the second thin film transistor TFT2, it may include a subpixel having a structure in which the second contact hole CNT2 is arranged under the pixel definition layer 209 instead of at a center portion of the second emission area EA2.

The planarization layer 207 may define a second contact hole CNT2 arranged under the pixel definition layer 209. A portion of the second pixel electrode 2212 that is not covered by the pixel definition layer 209 may be referred to as a second emission area EA2, and the second contact hole CNT2 may not overlap the second emission area EA2. A second emission layer 2222b may be disposed over the second pixel electrode 2212 and may emit light of a color different from the color of light emitted from the first emission layer 2221b. For example, the first emission layer 2221b may emit red light, and the second emission layer 2222b may emit green light.

A touch sensor layer may be disposed between the pixel definition layer 209 and the light blocking layer 530. The touch sensor layer may sense a user's touch input.

A first color filter CF1 may be disposed to fill an opening of the light blocking layer 530 corresponding to the first pixel electrode 2211. A second color filter CF2 may be disposed to fill an opening of the light blocking layer 530 corresponding to the second pixel electrode 2212. That is, the first color filter CF1 may overlap a portion of the first pixel electrode 2211 exposed by the pixel definition layer 209, and the second color filter CF2 may overlap a portion of the second pixel electrode 2212 exposed by the pixel definition layer 209.

In this case, the wavelength of light emitted by the first emission layer 2221b overlapping the first color filter CF1 may belong to a wavelength band that the first color filter CF1 passes. Also, the wavelength of light emitted by the second emission layer 2222b overlapping the second color filter CF2 may belong to a wavelength band that the second color filter CF2 passes. For example, when the first emission layer 2221b emits red light, the first color filter CF1 may pass red light, and when the second emission layer 2222b emits green light, the second color filter CF2 may pass green light.

As illustrated in FIG. 7 that is a cross-sectional view schematically illustrating a portion of a display apparatus according to another embodiment, a third pixel electrode 2213 electrically connected to a third thin film transistor TFT3 through the third contact hole CNT3 of the planarization layer 207 may be disposed over the planarization layer 207. A bank 310 apart from the pixel definition layer 209 and covering a portion of the third pixel electrode 2213 overlapping the third contact hole CNT3 may be disposed over the third pixel electrode 2213. Like the first contact hole CNT1, the third contact hole CNT3 may be arranged at a center portion of the third emission area EA3. Also, the third pixel electrode 2213 may be inclined toward the third contact hole CNT3. The inclination of the third pixel electrode 2213 with respect to the substrate 100 may be symmetrical with respect to the third contact hole CNT3.

A third emission layer 2223b may be disposed over the third pixel electrode 2213. The third emission layer 2223b may include a material emitting light of a different color than that emitted by the first emission layer 2221b.

The first color filter CF1 may be disposed to fill an opening of the light blocking layer 530 corresponding to the first pixel electrode 2211. A third color filter CF3 may be disposed to fill an opening of the light blocking layer 530 corresponding to the third pixel electrode 2213. The third color filter CF3 may overlap a portion of the third pixel electrode 2213 exposed by the pixel definition layer 209.

In this case, the wavelength of light emitted by the first emission layer 2221b overlapping the first color filter CF1 may belong to a wavelength band that the first color filter CF1 passes. Also, the wavelength of light emitted by the third emission layer 2223b overlapping the third color filter CF3 may belong to a wavelength band that the third color filter CF3 passes. For example, when the first emission layer 2221b emits red light, the first color filter CF1 may pass red light, and when the third emission layer 2223b emits blue light, the third color filter CF3 may pass blue light.

Figure 8:
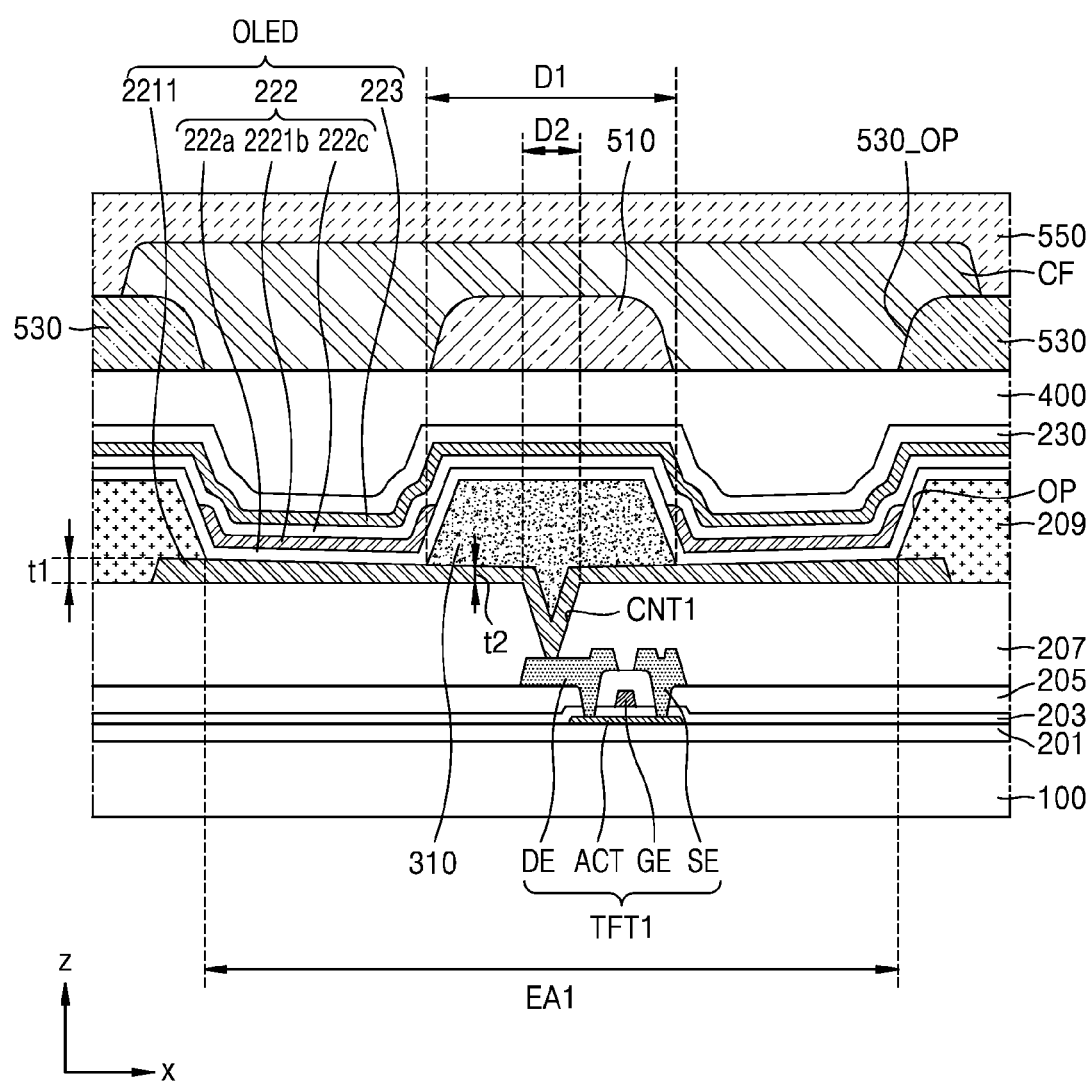
FIG. 8 is a cross-sectional view schematically illustrating a portion of a display apparatus according to another embodiment.

FIG. 8 is a cross-sectional view schematically illustrating a portion of a display apparatus according to another embodiment. The display apparatus according to the embodiment described with reference to FIG. 8 may be different from the display apparatus described above with reference to FIG. 3 in that a thickness t1 of a portion of the first pixel electrode 2211 under the pixel definition layer 209 is greater than a thickness t2 of another portion of the first pixel electrode 2211 under the bank 310. In this case, the thickness of the planarization layer 207 may be uniform. Like in the display apparatus described above with reference to FIG. 3, also in the case of the display apparatus according to the embodiment described herein, the upper surface of the first pixel electrode 2211 disposed over the planarization layer 207 may have a shape in which a portion over the first contact hole CNT1 arranged at a center portion of the first emission area EA1 is concave toward the substrate 100.

Figure 9:
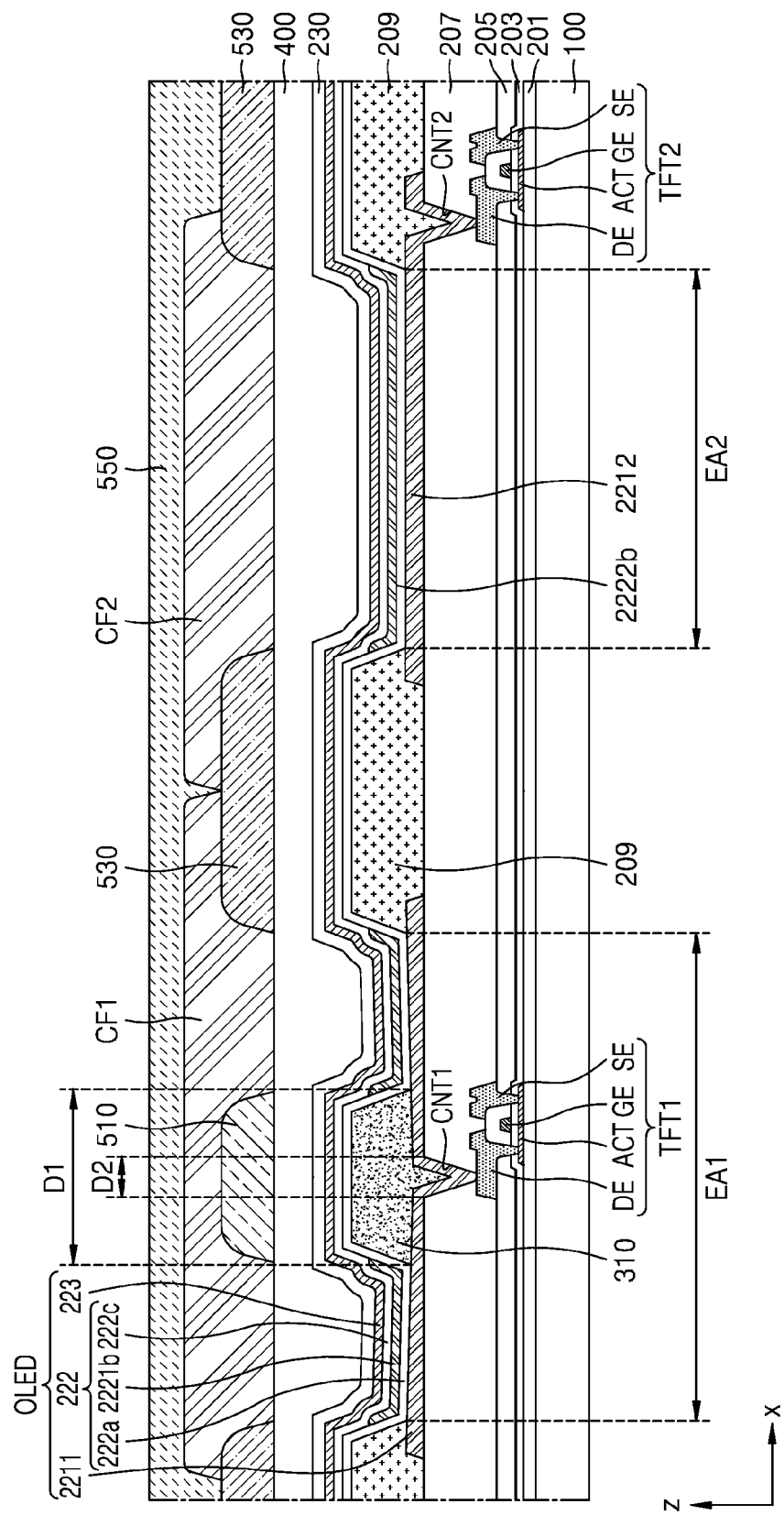
FIG. 9 is a cross-sectional view schematically illustrating a portion of a display apparatus according to another embodiment.

FIG. 9 is a cross-sectional view schematically illustrating a portion of a display apparatus according to another embodiment. The display apparatus according to the embodiment described with reference to FIG. 9 may be different from the display apparatus described above with reference to FIG. 6 in that a thickness t1 of a portion of the first pixel electrode 2211 under the pixel definition layer 209 is greater than a thickness t2 of another portion of the first pixel electrode 2211 under the bank 310. In this case, the thickness of the planarization layer 207 may be uniform. That is, the structure of the first pixel electrode 2211 and/or the planarization layer 207 may be the same as that described above with reference to FIG. 8. In the case of the second pixel electrode 2212, the thickness of a portion exposed by not being covered by the pixel definition layer 209 may be substantially uniform as illustrated in FIG. 9.

Although the organic light emitting display apparatus has been described above, the embodiment described herein is not limited thereto. For example, as illustrated in FIGS. 10 and 11 that are cross-sectional views schematically illustrating a portion of a display apparatus according to another embodiment, a quantum dot display apparatus may also fall within the scope of the embodiments described herein.

Figure 10:
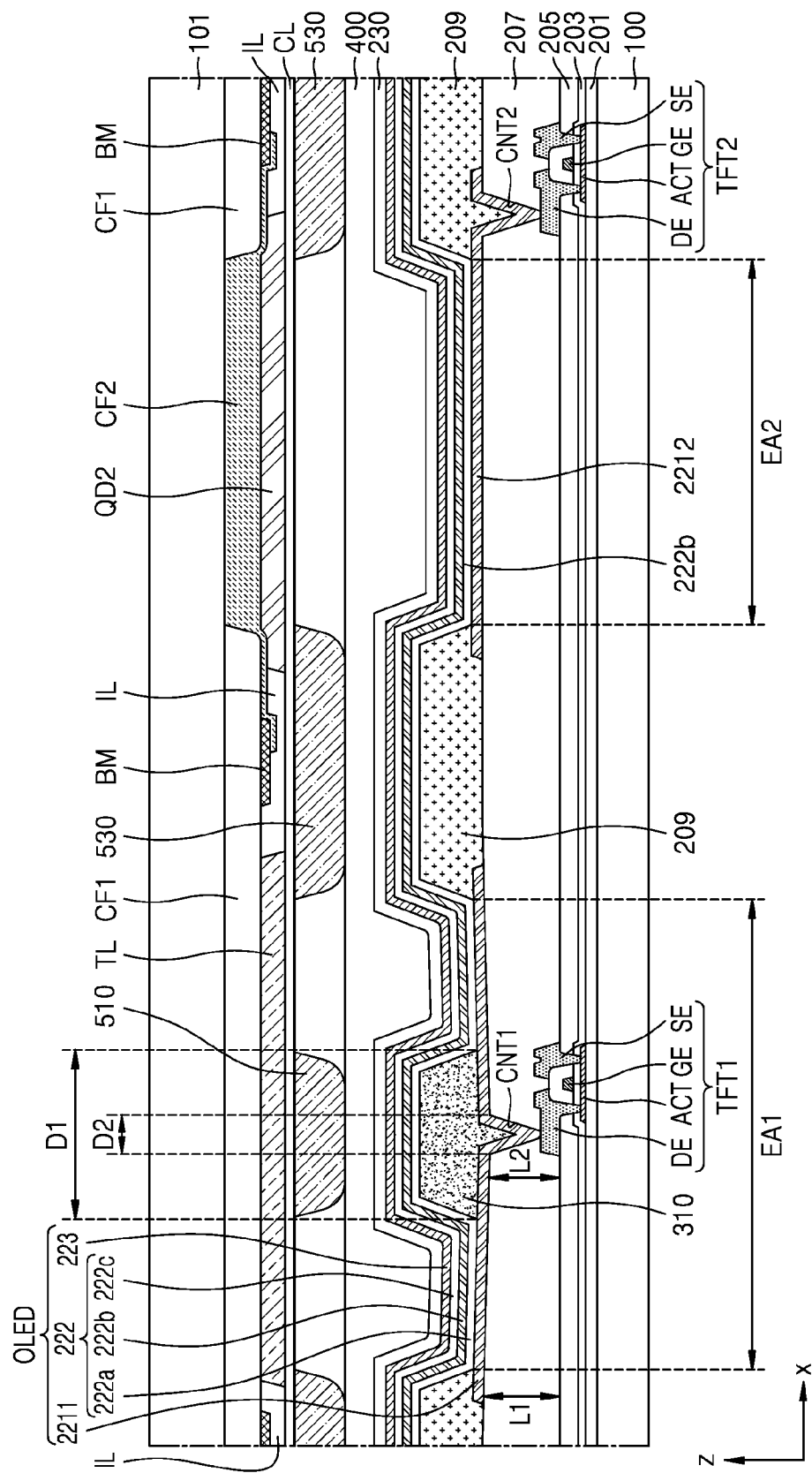
FIGS. 10 and 11 are cross-sectional views schematically illustrating a portion of a display apparatus according to another embodiment.
Figure 11:
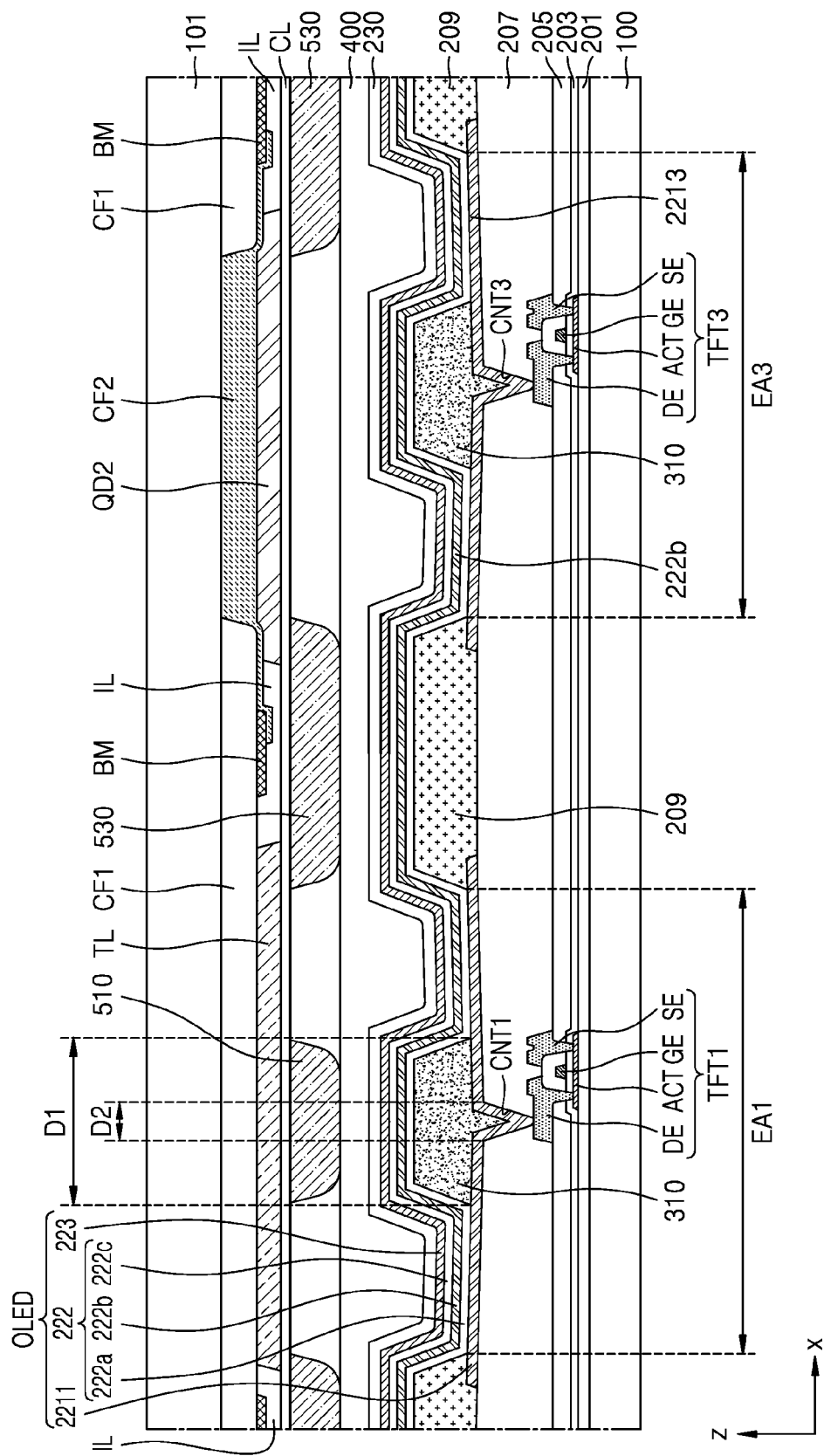

In the case of the quantum dot display apparatus, as illustrated in FIGS. 10 and 11, an emission layer 222b may have an integral shape in a first subpixel, a second subpixel, and a third subpixel. That is, the emission layer 222b may emit, for example, blue light in the first subpixel, the second subpixel, and the third subpixel.

An upper substrate 101 located over the substrate 100 with an organic light emitting diode OLED therebetween may include the same material as the substrate 100. For example, the upper substrate 101 may include glass, metal, or polymer resin.

A first color filter CF1 may be located on the lower surface of the upper substrate 101 in the direction to the substrate 100. The first color filter CF1 may pass the light emitted from the emission layer 222b. For example, the first color filter CF1 may pass blue light. The first color filter CF1 may include an opening corresponding to the second emission area EA2 and an opening corresponding to the third emission area EA3.

A black matrix BM may be located on the surface of the first color filter CF1 in the direction to the substrate 100. The black matrix BM may include the same material as the light blocking layer 530 and may absorb visible light. The black matrix BM may be located between the subpixels in the view in the direction perpendicular to the substrate 100 (z-axis direction). That is, the black matrix BM may be located to correspond to between the first emission area EA1, the second emission area EA2, and the third emission area EA3.

A second color filter CF2 may be located in an opening of the first color filter CF1 corresponding to the second emission area EA2, and a third color filter CF3 may be located in an opening of the first color filter CF1 corresponding to the third emission area EA3. Also, the second color filter CF2 may extend onto the black matrix BM, and the third color filter CF3 may also extend onto the black matrix BM.

The second color filter CF2 may pass, for example, green light, and the third color filter CF3 may pass red light.

An upper bank IL may be located between the first color filter CF1, the second color filter CF2, and/or the third color filter CF3 and the substrate 100. The upper bank IL may include openings corresponding to the first emission area EA1, the second emission area EA2, and the third emission area EA3. The upper bank IL may include silicon oxide, silicon nitride, or silicon oxynitride.

A transparent layer TL may be located in an opening of the upper bank IL corresponding to the first emission area EA1, a second quantum dot layer QD2 may be located in an opening of the upper bank IL corresponding to the second emission area EA2, and a third quantum dot layer QD3 may be located in an opening of the upper bank IL corresponding to the third emission area EA3.

The transparent layer TL may include acryl, benzocyclobutene (BCB), or hexamethyldisiloxane (HMDSO). In addition, the transparent layer TL may also include a scatterer. Also, in some cases, unlike the illustration in FIGS. 10 and 11, the transparent layer TL may not be provided in an opening of the upper bank IL corresponding to the first emission area EA1. In the first subpixel, the light (e.g., blue light) generated in the emission layer 222b may be emitted to the outside through the transparent layer TL and the upper substrate 101.

The second quantum dot layer QD2 may overlap the second pixel electrode 2212 in the view in the direction perpendicular to the substrate 100 (the z-axis direction). The second quantum dot layer QD2 may convert the light (e.g., blue light) passing through the second quantum dot layer QD2 into light of another color (e.g., green light).

The second quantum dot layer QD2 may have a form in which quantum dots are distributed in a resin. In the embodiment described hereinabove, the following embodiments, and modifications thereof, the quantum dot may refer to a crystal of a semiconductor compound and may include any material capable of emitting light of various emission wavelengths depending on the size of the crystal. The diameter of these quantum dot may be, for example, about 1 nm to about 10 nm.

The quantum dot may be synthesized by a wet chemical process, a metal organic chemical vapor deposition (MOCVD) process, a molecular beam epitaxy (MBE) process, or any similar process. The wet chemical process may be a method of growing a quantum dot particle crystal after mixing an organic solvent and a precursor material. In the case of the wet chemical process, when a crystal grows, because an organic solvent naturally functions as a dispersant coordinated on the surface of a quantum dot crystal and controls the growth of the crystal, it may be easier than vapor deposition such as metal-organic chemical vapor deposition (MOCVD) or molecular beam epitaxy (MBE). Also, in the case of the wet chemical process, it may control the growth of quantum dot particles while being a low-cost process.

The quantum dot may include a group III-VI semiconductor compound, a group II-VI semiconductor compound, a group III-V semiconductor compound, a group semiconductor compound, a group IV-VI semiconductor compound, a group IV element or compound, or any combination thereof.

Examples of the group III-VI semiconductor compound may include a binary compound such as $In_2S_3$, a ternary compound such as AgInS, $AgInS_2$, CuInS, or $CuInS_2$, or any combination thereof.

Examples of the Group II-VI semiconductor compound may include a binary compound such as CdS, CdSe, CdTe, ZnS, ZnSe, ZnTe, ZnO, HgS, HgSe, HgTe, MgSe, or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound such as CdZnSeS, CdZnSeTe, CdZnSTe, CdHgSeS, CdHgSeTe, CdHgSTe, HgZnSeS, HgZnSeTe, or HgZnSTe, or any combination thereof.

Examples of the Group III-V semiconductor compound may include a binary compound such as GaN, GaP, GaAs, GaSb, AlN, AlP, AlAs, AlSb, InN, InP, InAs, or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb, a quaternary compound such as GaAlNAs, GaAlNSb, GaAlNP, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. Moreover, the group III-V semiconductor compound may further include a group II element. Examples of the group III-V semiconductor compound further including a group II element may include InZnP, InGaZnP, or InAlZnP.

Examples of the group semiconductor compound may include a ternary compound such as AgInS, AgInS$_2$, CuInS, CuInS$_2$, CuGaO$_2$, AgGaO$_2$, or AgAlO$_2$, or any combination thereof.

Examples of the group IV-VI semiconductor compound may include a binary compound such as SnS, SnSe, SnTe, PbS, PbSe, or PbTe, a ternary compound such as SnSeS, SnSeTe, SnSTe, PbSeS, PbSeTe, PbSTe, SnPbS, SnPbSe, or SnPbTe, a quaternary compound such as SnPbSSe, SnPbSeTe, or SnPbSTe, or any combination thereof.

The group IV element or compound may include a single-element compound such as Si or Ge, a binary compound such as SiC or SiGe, or any combination thereof.

Each element included in a multi-element compound such as a binary compound, a ternary compound, and a quaternary compound may be in a particle at a uniform concentration or at a nonuniform concentration.

Moreover, the quantum dot may have a core-shell double structure or a single structure in which the concentration of each element included in the quantum dot is uniform. For example, the material included in the core and the material included in the shell may be different from each other. The shell of the quantum dot may function as a protection layer for preventing chemical modification of the core to maintain semiconductor characteristics and/or as a charging layer for assigning electrophoretic characteristics to the quantum dot. The shell may include a single layer or a multilayer. The interface between the core and the shell may have a concentration gradient in which the concentration of elements in the shell decreases toward the center thereof.

Examples of the shell of the quantum dot may include a metal or nonmetal oxide, a semiconductor compound, or any combination thereof. Examples of the metal or nonmetal oxide may include a binary compound such as SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, or NiO, a ternary compound such as MgAl$_2$O$_4$, CoFe$_2$O$_4$, NiFe$_2$O$_4$, or CoMn$_2$O$_4$, or any combination thereof. Examples of the semiconductor compound may include a group III-VI semiconductor compound, a group II-VI semiconductor compound, a group III-V semiconductor compound, a group I-III-VI semiconductor compound, a group IV-VI semiconductor compound, or any combination thereof, as described above. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of an emission wavelength spectrum of about 45 nm or less, for example, about 40 nm or less or about 30 nm or less, and in this range, the color purity or the color reproducibility thereof may be improved. Also, because the light emitted through the quantum dot is emitted in all directions, the optical viewing angle thereof may be improved.

Also, particularly, the shape of the quantum dot may be a shape such as sphere, pyramid, multi-arm or cube, nanoparticle, nanotube, nanowire, nanofiber, or nanoplate particle.

Because the energy band gap may be adjusted by adjusting the size of the quantum dot, light of various wavelengths may be obtained from a quantum dot emission layer. Thus, by using quantum dots of different sizes, a light emitting device emitting light of various wavelengths may be implemented. Particularly, the size of the quantum dot may be selected to emit red, green, and/or blue light. Also, the size of the quantum dot may be configured to emit white light by combining light of various colors.

The second quantum dot layer QD2 may include a scatterer. Incident light may be scattered by the scatterer included in the second quantum dot layer QD2, and thus the incident light may be efficiently converted by the quantum dot in the second quantum dot layer QD2. The scatterer may not be particularly limited as long as it is a material capable of partially scattering transmitted light by forming an optical interface between the scatterer and a transparent resin, and may be, for example, metal oxide particles or organic particles. The metal oxide for the scatterer may include titanium oxide (TiO$_2$), zirconium oxide (ZrO$_2$), aluminum oxide (Al$_2$O$_3$), indium oxide (In$_2$O$_3$), zinc oxide (ZnO), or tin oxide (SnO$_2$), and the organic material for the scatterer may include acryl-based resin or urethane-based resin. The scatterer may scatter light in various directions regardless of the incidence angle without substantially converting the wavelength of the incident light. Accordingly, the scatterer may improve the side visibility of the display apparatus. Also, the scatterer included in the second quantum dot layer QD2 may increase the light conversion efficiency by increasing the probability that the incident light incident on the second quantum dot layer QD2 will meet the quantum dot.

The resin included in the second quantum dot layer QD2 may include any material that is transparent while having excellent dispersion characteristics for the scatterer. For example, a polymer resin such as acryl-based resin, imide-based resin, epoxy-based resin, benzocyclobutene (BCB), or hexamethyldisiloxane (HMDSO) may be used as a material for forming the second quantum dot layer QD2. The material for forming the second quantum dot layer QD2 may be located in an opening of the upper bank IL overlapping the first pixel electrode 2211 through an inkjet printing process.

A third quantum dot layer QD3 may be located in an opening of the upper bank IL overlapping the third pixel electrode 2213. The third quantum dot layer QD3 may overlap the third pixel electrode 2213 in the view in the direction perpendicular to the substrate 100 (the z-axis direction). The third quantum dot layer QD3 may convert the light (e.g., blue light) passing through the third quantum dot layer QD3 into light of another color (e.g., red light).

The third quantum dot layer QD3 may have a form in which quantum dots are distributed in a resin. In the embodiment described herein, the following embodiments, and modifications thereof, the quantum dot may refer to a crystal of a semiconductor compound and may include any material capable of emitting light of various emission wavelengths depending on the size of the crystal. The diameter of these quantum dot may be, for example, about 1 nm to about 10 nm. Because the description of the quantum dot included in the second quantum dot layer QD2 may be applied to the quantum dot included in the third quantum dot layer QD3, redundant descriptions of the quantum dot included in the third quantum dot layer QD3 will be omitted for conciseness.

The third quantum dot layer QD3 may include a scatterer. Incident light may be scattered by the scatterer included in the third quantum dot layer QD3, and thus the incident light may be efficiently converted by the quantum dot in the third quantum dot layer QD3. The scatterer may not be particularly limited as long as it is a material capable of partially scattering transmitted light by forming an optical interface between the scatterer and a transparent resin, and may be, for example, metal oxide particles or organic particles. The metal oxide for the scatterer and the organic material for the scatterer may be the same as those described above. The scatterer may scatter light in various directions regardless of the incidence angle without substantially converting the wavelength of the incident light. Accordingly, the scatterer may improve the side visibility of the display apparatus. Also, the scatterer included in the third quantum dot layer QD3 may increase the light conversion efficiency by increasing the probability that the incident light incident on the third quantum dot layer QD3 will meet the quantum dot.

The resin included in the third quantum dot layer QD3 may include any material that is transparent while having excellent dispersion characteristics for the scatterer. For example, a polymer resin such as acryl-based resin, imide-based resin, epoxy-based resin, benzocyclobutene (BCB), or hexamethyldisiloxane (HMDSO) may be used as a material for forming the third quantum dot layer QD3. The material for forming the third quantum dot layer QD3 may be located in an opening of the upper bank IL overlapping the third pixel electrode 2213 through an inkjet printing process.

In order to protect the transparent layer TL, the second quantum dot layer QD2, and the third quantum dot layer QD3, a cover layer CL may be located on the surface of the transparent layer TL, the second quantum dot layer QD2, and the third quantum dot layer QD3 in the direction to the substrate 100 as illustrated in FIG. 11. The cover layer CL may include an inorganic material such as silicon oxide or silicon nitride. For example, the cover layer CL may have a two-layer structure including a silicon oxide layer and a silicon nitride layer. The light blocking layer 530 and the bank light blocking layer 510 described above may be located on the surface of the cover layer CL in the direction to the substrate 100. Also, when necessary, a transparent layer TL may be disposed to fill an opening of the light blocking layer 530.

Even in the case of the quantum dot display apparatus, the structure of the planarization layer 207, the first pixel electrode 2211, the second pixel electrode 2212, and the third pixel electrode 2213 described above with reference to FIGS. 6 and 7 may be used to implement a display apparatus with an improved reflective color sense. Alternatively, even in the case of the quantum dot display apparatus, the structure of the first pixel electrode 2211 described above with reference to FIG. 9 may be used to implement a display apparatus with an improved reflective color sense. In this case, the third pixel electrode 2213 of FIG. 11 may also have the same structure as the first pixel electrode 2211 described above with reference to FIG. 9.

As described above, according to an embodiment, a display apparatus for improving a reflective color sense may be implemented. However, the scope of the embodiments described hereinabove is not limited to these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a thin film transistor disposed over a substrate;
   a planarization layer disposed over the thin film transistor;
   a pixel electrode disposed over the planarization layer and electrically connected to the thin film transistor through a contact hole provided in the planarization layer;
   a pixel definition layer covering an edge of the pixel electrode to expose a center portion of the pixel electrode; and
   a bank arranged apart from the pixel definition layer and disposed over an area of a portion of the pixel electrode exposed by the pixel definition layer, the bank overlapping the contact hole when viewed in a direction perpendicular to the substrate.

2. The display apparatus of claim 1, wherein the contact hole is arranged at a center portion of a portion of the pixel electrode exposed by the pixel definition layer.

3. The display apparatus of claim 2, wherein an inclination direction of an upper surface of the planarization layer with respect to the substrate on one side of the contact hole is opposite to an inclination direction of the upper surface of the planarization layer with respect to the substrate on another side of the contact hole.

4. The display apparatus of claim 1, wherein a thickness of a portion of the planarization layer under the pixel definition layer is greater than a thickness of another portion of the planarization layer under the bank.

5. The display apparatus of claim 1, wherein a thickness of a portion of the pixel electrode under the pixel definition layer is greater than a thickness of another portion of the pixel electrode under the bank.

6. The display apparatus of claim 1, wherein an area of the bank is greater than an area of the contact hole when viewed in the direction perpendicular to the substrate.

7. The display apparatus of claim 1, further comprising an opposite electrode integrally formed as a single body and disposed over the pixel definition layer and the bank.

8. The display apparatus of claim 1, further comprising:
   a light blocking layer disposed above the pixel definition layer and including an opening overlapping a portion of the pixel electrode exposed by the pixel definition layer when viewed in the direction perpendicular to the substrate; and
   a bank light blocking layer disposed above the bank and overlapping the bank when viewed in the direction perpendicular to the substrate.

9. The display apparatus of claim 8, wherein the bank light blocking layer includes a material absorbing visible light.

10. A display apparatus comprising:
    a first thin film transistor and a second thin film transistor disposed over a substrate;

a planarization layer disposed over the first thin film transistor and the second thin film transistor;

a first pixel electrode disposed over the planarization layer and electrically connected to the first thin film transistor through a first contact hole defined in the planarization layer;

a second pixel electrode disposed over the planarization layer and electrically connected to the second thin film transistor through a second contact hole provided in the planarization layer;

a pixel definition layer covering an edge of the first pixel electrode, an edge of the second pixel electrode, and a portion of the second pixel electrode overlapping the second contact hole to expose a portion of the first pixel electrode overlapping the first contact hole, a center portion of the first pixel electrode, and a center portion of the second pixel electrode; and a bank arranged apart from the pixel definition layer and disposed over an area of a portion of the first pixel electrode exposed by the pixel definition layer, the bank overlapping the first contact hole when viewed in a direction perpendicular to the substrate.

11. The display apparatus of claim 10, wherein the first contact hole is arranged at a center portion of a portion of the first pixel electrode exposed by the pixel definition layer.

12. The display apparatus of claim 11, wherein an inclination direction of an upper surface of the planarization layer with respect to the substrate on one side of the first contact hole is opposite to an inclination direction of the upper surface of the planarization layer with respect to the substrate on another side of the first contact hole.

13. The display apparatus of claim 10, wherein a thickness of a portion of the planarization layer under the pixel definition layer is greater than a thickness of another portion of the planarization layer under the bank.

14. The display apparatus of claim 10, wherein a thickness of a portion of the first pixel electrode under the pixel definition layer is greater than a thickness of another portion of the first pixel electrode under the bank.

15. The display apparatus of claim 14, wherein a thickness of the second pixel electrode is uniform.

16. The display apparatus of claim 10, wherein an area of the bank is greater than an area of the first contact hole when viewed in the direction perpendicular to the substrate.

17. The display apparatus of claim 10, further comprising an opposite electrode integrally formed as a single body and disposed over the pixel definition layer and the bank.

18. The display apparatus of claim 10, further comprising:
a first emission layer disposed over the first pixel electrode and emitting light of a first color; and
a second emission layer disposed over the second pixel electrode and emitting light of a second color different from light of the first color emitted by the first emission layer.

19. The display apparatus of claim 10, further comprising:
a light blocking layer disposed above the pixel definition layer and including openings overlapping portions of the first pixel electrode and the second pixel electrode exposed by the pixel definition layer when viewed in the direction perpendicular to the substrate; and
a bank light blocking layer disposed above the bank and overlapping the bank when viewed in the direction perpendicular to the substrate.

20. The display apparatus of claim 19, wherein the bank light blocking layer includes a material absorbing visible light.

21. The display apparatus of claim 19, further comprising a first color filter filling the opening of the light blocking layer corresponding to the first pixel electrode and a second color filter filling the opening of the light blocking layer corresponding to the second pixel electrode,
wherein the first color filter overlaps a portion of the first pixel electrode exposed by the pixel definition layer, and the second color filter overlaps a portion of the second pixel electrode exposed by the pixel definition layer.

* * * * *